United States Patent
Li et al.

(10) Patent No.: US 12,369,468 B2
(45) Date of Patent: Jul. 22, 2025

(54) DISPLAY MODULE AND DISPLAY DEVICE

(71) Applicant: Wuhan Tianma Micro-Electronics Co., Ltd., Wuhan (CN)

(72) Inventors: Shengming Li, Wuhan (CN); Jiang Chen, Wuhan (CN); Qifeng Zhu, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 463 days.

(21) Appl. No.: 18/090,339

(22) Filed: Dec. 28, 2022

(65) Prior Publication Data

US 2024/0147787 A1 May 2, 2024

(30) Foreign Application Priority Data

Oct. 27, 2022 (CN) .......................... 202211326271.7

(51) Int. Cl.
*H10K 59/131* (2023.01)
*G06V 40/13* (2022.01)
*H10D 89/60* (2025.01)
*H10K 59/80* (2023.01)

(52) U.S. Cl.
CPC ....... *H10K 59/131* (2023.02); *G06V 40/1318* (2022.01); *H10D 89/60* (2025.01); *H10K 59/8722* (2023.02)

(58) Field of Classification Search
None
See application file for complete search history.

(56) References Cited

U.S. PATENT DOCUMENTS

2014/0254111 A1\* 9/2014 Yamazaki ............ H10K 59/131
361/749

\* cited by examiner

*Primary Examiner* — Kyoung Lee
(74) *Attorney, Agent, or Firm* — Anova Law Group, PLLC

(57) ABSTRACT

A display module includes a display panel, a flexible printed circuit, a composite adhesive layer, and at least one conductive structure. The display panel includes a base substrate. The flexible printed circuit includes at least one first conductive region, and is electrically connected to the display panel. The composite adhesive layer is located at one side of the base substrate away from a light emission surface of the display panel. The composite adhesive layer includes at least one first through hole penetrating through the composite adhesive layer, and the conductive structure is at least partially located within the first through hole. Along a direction perpendicular to a plane where the base substrate is located, length of the composite adhesive layer is H1, and length of the conductive structure is H2, where H1≤H2. The conductive structure is electrically connected to the first conductive region.

20 Claims, 23 Drawing Sheets

DISPLAY MODULE AND DISPLAY DEVICE

CROSS-REFERENCE TO RELATED APPLICATION

This application claims the priority to Chinese patent application No. 202211326271.7, filed on Oct. 27, 2022, the entirety of which is incorporated herein by reference.

TECHNICAL FIELD

The present disclosure relates to the technical field of display and, more particularly, to a display module and a display device.

BACKGROUND

With a vigorous development of flat-panel display technology, organic light-emitting display (OLED) has been widely used due to excellent characteristics including self-illumination, high brightness, wide viewing angle, fast response, etc.

Problems caused by static electricity have a high impact on a display effect of a display panel, which cannot be ignored. Therefore, it is a technical problem to be solved urgently by those skilled in the art to provide a display panel and a display device that can improve electrostatic protection ability, effectively prevent the static electricity from entering a display screen, and improve product yield and display quality.

SUMMARY

In accordance with the disclosure, there is provided a display module including a display panel, a flexible printed circuit, a composite adhesive layer, and at least one conductive structure. The display panel includes a base substrate. The flexible printed circuit includes at least one first conductive region, and is electrically connected to the display panel. The composite adhesive layer is located at one side of the base substrate away from a light emission surface of the display panel. The composite adhesive layer includes at least one first through hole penetrating through the composite adhesive layer, and the conductive structure is at least partially located within the first through hole. Along a direction perpendicular to a plane where the base substrate is located, length of the composite adhesive layer is H1, and length of the conductive structure is H2, where H1≤H2. The conductive structure is electrically connected to the first conductive region.

Also in accordance with the disclosure, there is provided a display device including a display module. The display module includes a display panel, a flexible printed circuit, a composite adhesive layer, and at least one conductive structure. The display panel includes a base substrate. The flexible printed circuit includes at least one first conductive region, and is electrically connected to the display panel. The composite adhesive layer is located at one side of the base substrate away from a light emission surface of the display panel. The composite adhesive layer includes at least one first through hole penetrating through the composite adhesive layer, and the conductive structure is at least partially located within the first through hole. Along a direction perpendicular to a plane where the base substrate is located, length of the composite adhesive layer is H1, and length of the conductive structure is H2, where H1≤H2. The conductive structure is electrically connected to the first conductive region.

BRIEF DESCRIPTION OF THE DRAWINGS

The accompanying drawings, which are incorporated in and constitute a part of this specification, illustrate the embodiments of the present disclosure and together with the description serve to explain the principles of the present disclosure.

DETAILED DESCRIPTION OF THE EMBODIMENTS

Various exemplary embodiments of the present disclosure will be described in detail with reference to the accompanying drawings. It should be noted that relative arrangements of components and processes, numerical expressions, and numerical values set forth in these embodiments do not limit the scope of the present disclosure unless specifically stated otherwise.

The following description of at least one exemplary embodiment is for illustrative only and is not taken as any limitation of the present disclosure and applications thereof.

Techniques, methods, and devices known to those of ordinary skill in the art may not be discussed in detail, but where appropriate, such techniques, methods, and devices should be considered as part of the present specification.

In all examples shown and discussed herein, any specific values should be construed as exemplary only rather than limitations. Therefore, other instances than the exemplary embodiments may have different values that may be encompassed within the scope of the present disclosure.

It should be noted that similar numbers and letters may denote similar items in the following drawings. Therefore, once an item is defined in one drawing, further discussion thereof in subsequent drawings is not required.

Figure 1:
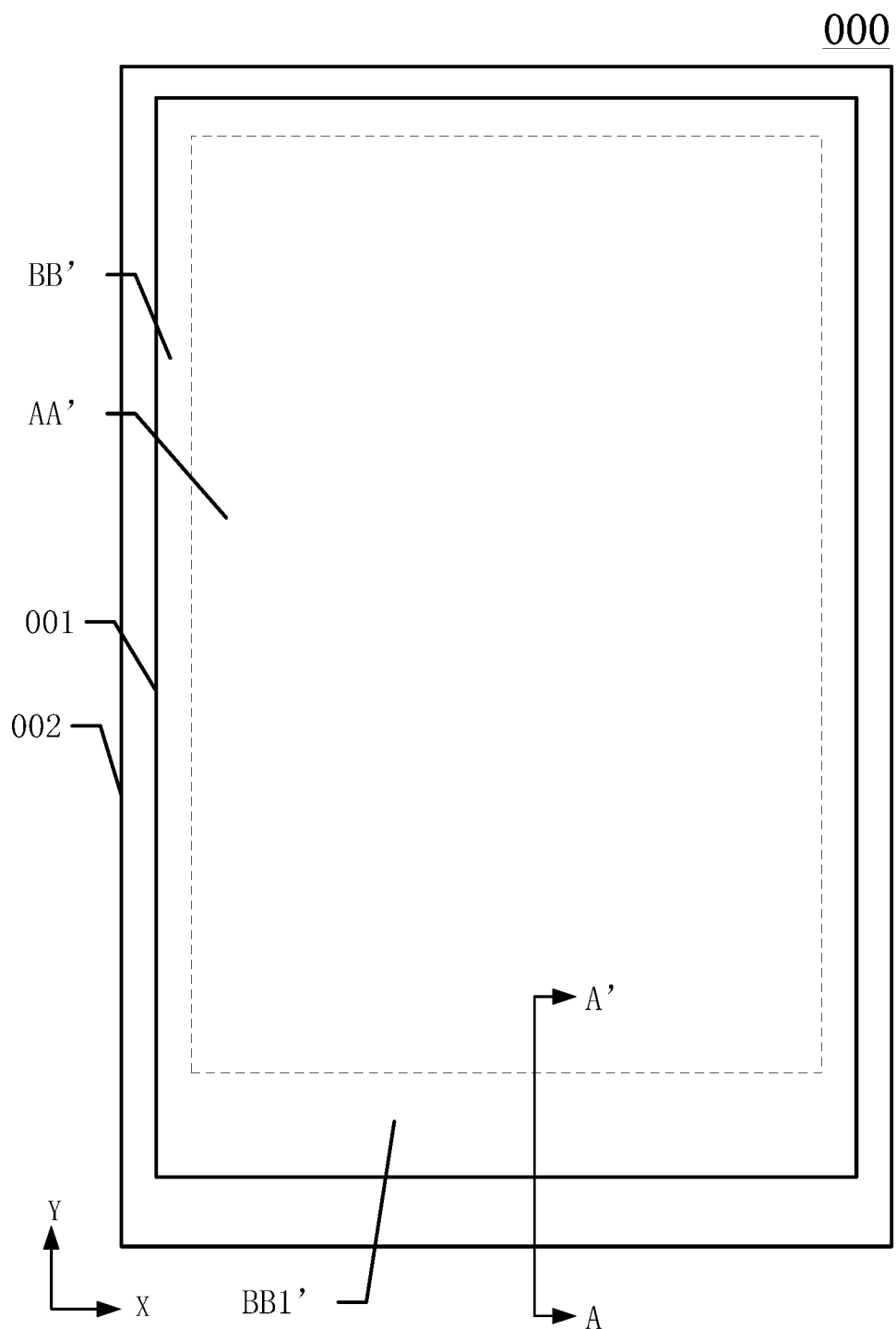
FIG. 1 is a plan view of a display module in related technologies.
Figure 2:
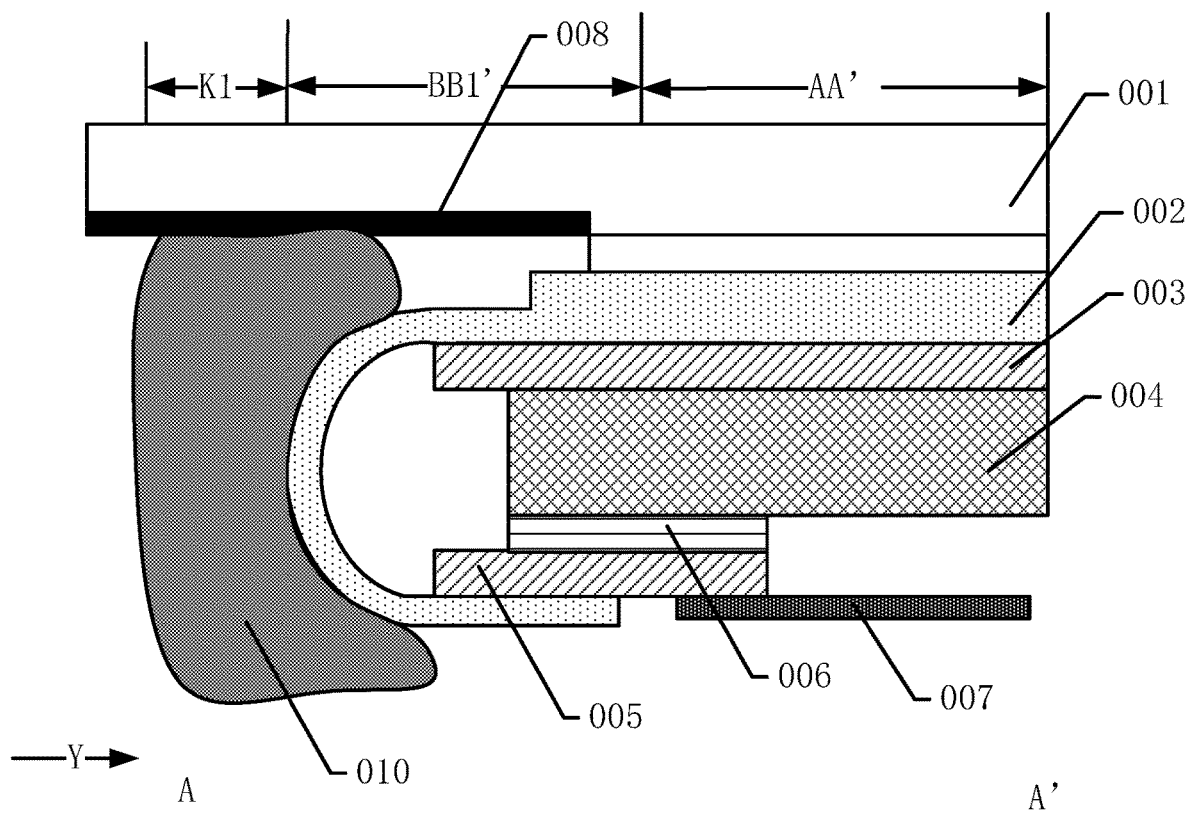
FIG. 2 is a cross-sectional view along direction A-A' in FIG. 1.

In related technologies, static electricity is easy to enter a display panel, and there are risks such as bright display around a screen, abnormal screen display or split screen phenomenon, decreased sensitivity or even failure, etc. Therefore, the following researches on the related technologies are conducted, and it is found that problem of static electricity accumulation often occurs in the display panel. For example, an organic light-emitting display panel generally includes an array substrate, a plurality of organic light-emitting diodes located on the array substrate, and an encapsulation layer arranged at one side of the organic light-emitting diodes away from the array substrate and covers the organic light-emitting diodes. The static electricity is generated in a process of making the above structures, such as a cutting process, a process of testing or using the organic light-emitting display panel. Also, before a display screen leaves a factory, an electrostatic protection test or a copper rod friction test on the display screen needs to be performed, and negative charges are likely to be generated during such test process. As another example, a large number of electrostatic charges are generated when a drop test is performed on the display screen, and both positive and negative charges are generated. In addition, the static electricity is also accumulated at a surface of a cover plate of an organic light-emitting display device after long-term friction. The electrostatic charges enter inside of the screen from edges of the cover plate of a display device, thereby affecting electrical properties of transistors inside the display screen (for example, a threshold voltage of the transistor is easily positively biased). Therefore, there are risks such as bright display around the screen, abnormal screen display or split screen phenomenon, decreased sensitivity or even failure, etc., which reduce user experience and even service life of the display device, and affect display effect. FIG. 1 is a plan view of a display module in related technologies, and FIG. 2 is a cross-sectional view along direction A-A' in FIG. 1. In FIG. 1, a display module 000 includes a display panel 002 and a cover plate 001 located at light emission side of the display panel 002, and a light shield layer 008 is provided at the cover plate 001 to prevent light leakage from edges of the display module. The display panel 000 includes a display area AA' and BB' surrounding the display area AA', and the display panel 000 includes a lower frame BB1' along a second direction Y. As shown in FIG. 2, the display panel 000 is bent in an area of the lower frame BB1' to a backlight side of the display panel 000, and a first support layer 003 is provided at the backlight side of the display panel 000. A composite tape 004 is provided at one side of the first support layer 003 away from the cover plate 001, and a second support layer 005 is provided at one side of the composite tape 004 away from the cover plate 001, where the second support layer 005 and the composite tape 004 are connected by a double-sided adhesive 006. The display panel 000 is bent and attached to back side of the second support layer 005, and then a flexible printed circuit 007 is bound to the display panel 000. A conductive liquid or conductive silver paste 010 is arranged at a position close to the lower frame BB1' of the display module, and charges are exported through the conductive liquid or conductive silver paste 010. However, the conductive liquid or conductive silver paste 010 occupies space K1, so that width of the display module in the second direction Y is also virtually increased, which is not conducive to realizing a narrow frame. If there is no additional space K1 set for the conductive liquid or conductive silver paste, there is another problem of insufficient avoidance space at a lower edge of the display module. Moreover, part of the display panel 000 bent to back side is mainly signal lines in a conductive layer, so that the conductive liquid or conductive silver paste 010 need to be arranged between adjacent signal lines to prevent signal crosstalk, and arrangement of the conductive liquid or conductive silver paste has relatively high process requirements, which has a problem of yield loss.

In view of this, the present disclosure provides a display module and a display device, so as to solve problems such as bright display around the screen, abnormal screen display or split screen phenomenon, decreased sensitivity or even failure, etc. due to that the electrostatic charges are easy to be generated in the display module and enter the display panel. Also, space at the lower edge of the display module is not increased, which improves product yield.

Figure 3:
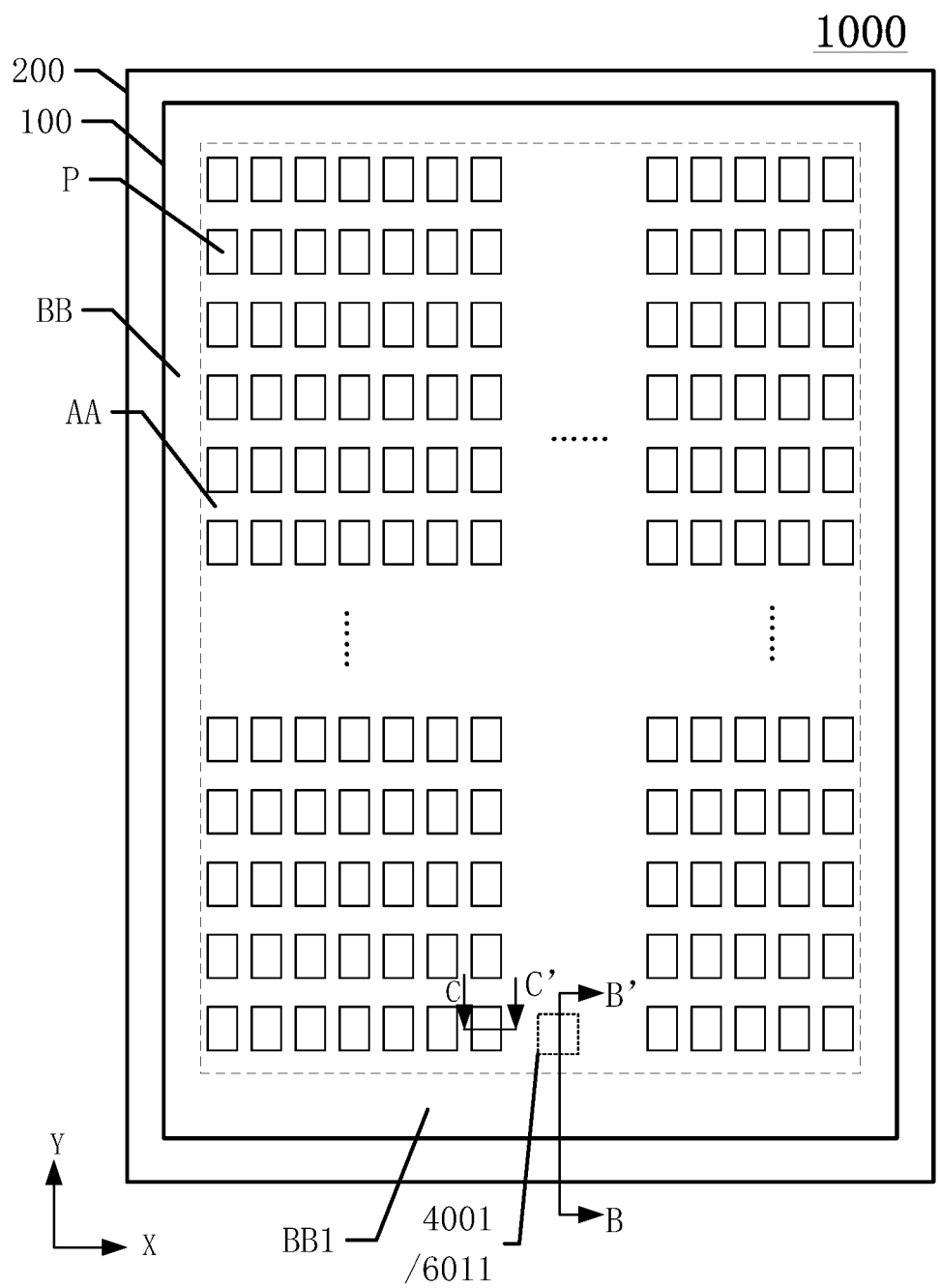
FIG. 3 is a schematic plan view of a display module according to an embodiment of the present disclosure.
Figure 4:
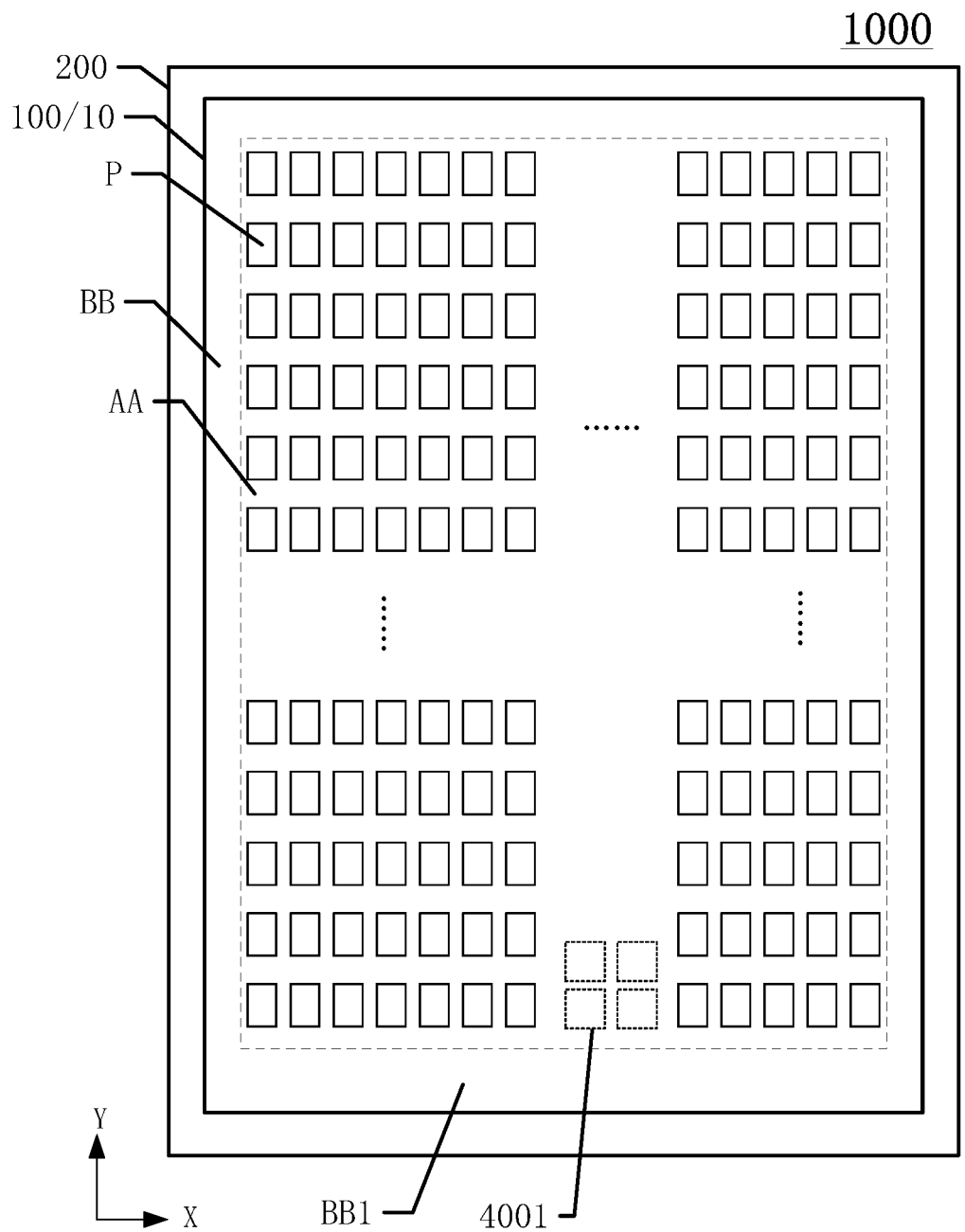
FIG. 4 is a schematic plan view of another display module according to an embodiment of the present disclosure.
Figure 5:
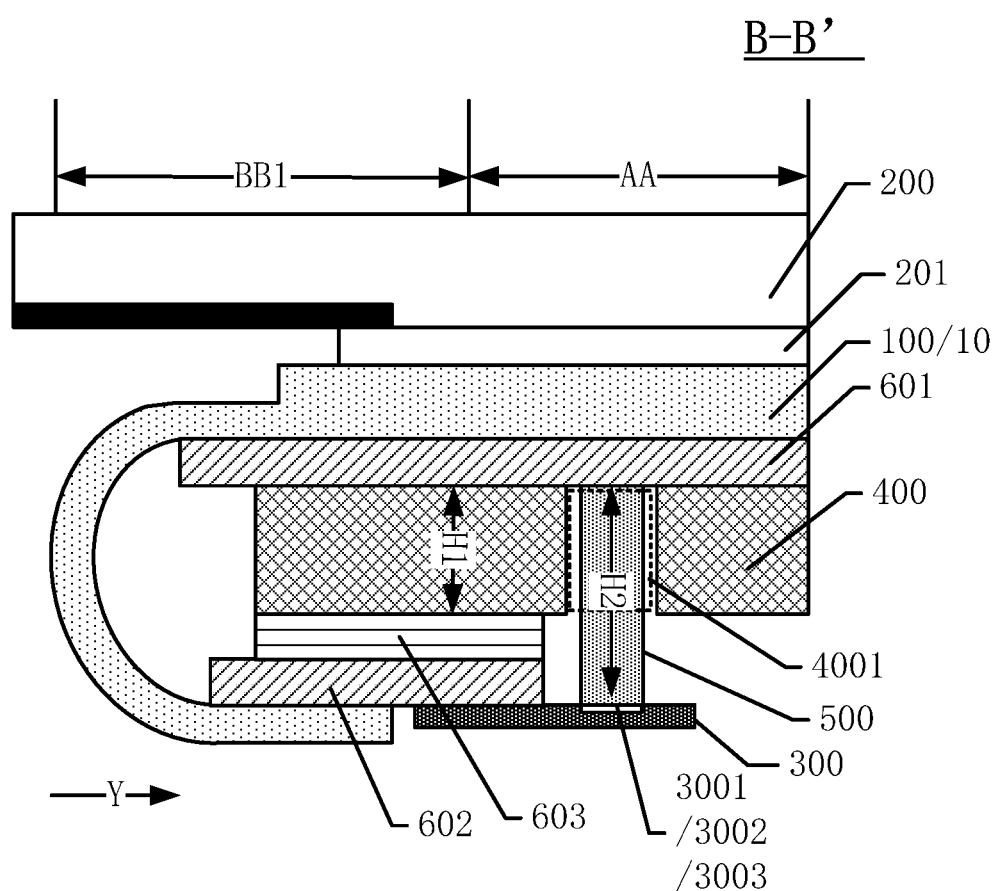
FIG. 5 is a cross-sectional view along direction B-B' in FIG. 3.
Figure 6:
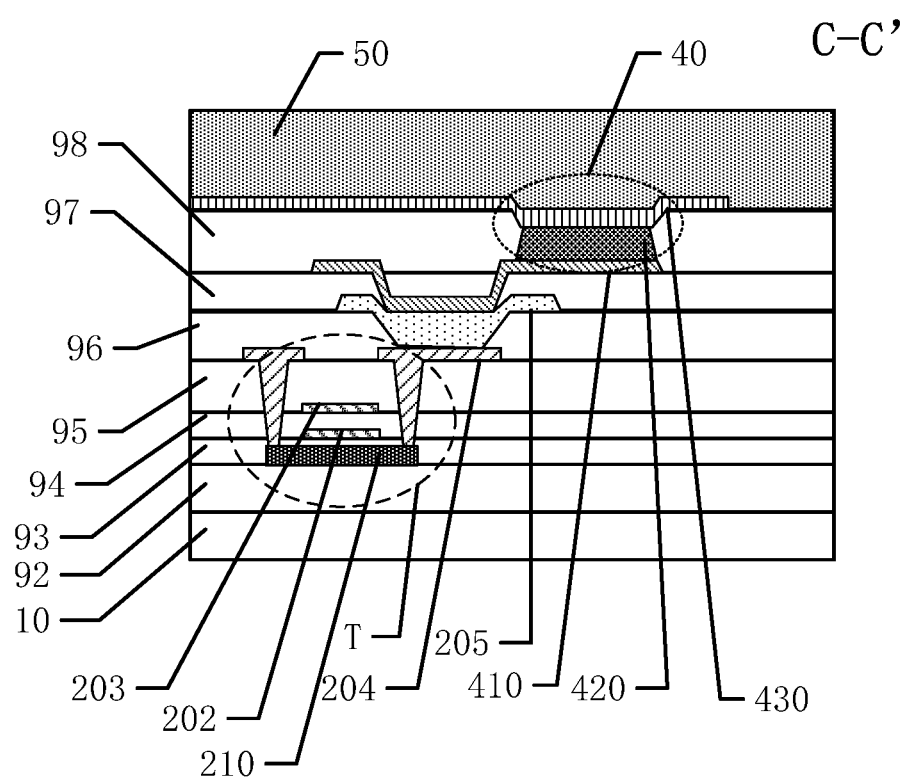
FIG. 6 is a cross-sectional view along direction C-C' in FIG. 3.

FIG. 3 is a schematic plan view of a display module according to an embodiment of the present disclosure, and FIG. 4 is a schematic plan view of another display module according to an embodiment of the present disclosure. FIG. 5 is a cross-sectional view along direction B-B' in FIG. 3, and FIG. 6 is a cross-sectional view along direction C-C' in FIG. 3. A display module 1000 consistent with the present disclosure includes a display panel 100, a flexible printed circuit 300, a composite adhesive layer 400, and at least one conductive structure 500. The display panel 100 includes a base substrate 10. The flexible printed circuit 300 includes at least one first conductive region 3001, and the flexible printed circuit 300 is electrically connected to the display panel 100. The composite adhesive layer 400 is located at one side of the base substrate 10 away from light emission surface of the display panel 100. The composite adhesive layer 400 includes at least one first through hole 4001 penetrating through the composite adhesive layer 400, and the conductive structure 500 is at least partially located within the first through hole 4001. Along a direction perpendicular to a plane where the base substrate 10 is located, length of the composite adhesive layer 400 is H1, and length of the conductive structure 500 is H2, where H1≤H2. The conductive structure 500 is electrically connected to the first conductive region 3001.

In some embodiments, the display panel 100 may be an organic light-emitting display panel. A display principle of the organic light-emitting display panel is that an anode and a cathode of a light emission device are driven by a certain electric field, and electrons and holes are respectively injected from the cathode and the anode into electron and hole transport layers. The electrons and holes respectively migrate to a light emission layer of the light emission device through the electron and hole transport layers, and meet in the light emission layer to form excitons and excite light emission molecules. When power is supplied to an appropriate voltage, anode holes and cathode charges combine in the light emission layer to produce light, and three primary colors of red, green, and blue are produced according to different formulas, which constitute basic colors and form a display screen. In some embodiments, there may include a plurality of sub-pixels P of different colors (not filled in the figures) in a display area AA of the display panel 100, where the sub-pixels P are arranged in an array along a first direction X and the second direction Y. Specific structure of various sub-pixels P can be made by film layers such as a driving circuit layer, a planarization layer, an anode layer, a pixel definition layer, an organic light emission layer, a cathode layer, a thin film encapsulation layer, etc., that are arranged on the base substrate 10. FIG. 6 only shows a brief illustration of a film layer structure of the display panel 100, and specific film layer structure within a range of the display area AA of the display panel 100 will not be described in detail herein. As for details, reference may be made to a design structure of the organic light-emitting display panel in the related technologies for understanding.

In some embodiments, the display panel 100 includes the display area AA and a non-display area BB at least partially arranged around the display area AA. The non-display area BB can be arranged only around part of the display area AA, or the non-display area BB can be arranged around an entire display area AA. The present disclosure does not specifically limit arrangement shape of the non-display area BB. The non-display area BB can be arranged in a shape of a closed ring around the display area AA, i.e., the non-display area BB can be completely arranged around the display area AA. The non-display area BB can also be arranged in a shape of an unclosed arc around the display area AA, i.e., the non-display area BB can also be arranged only around part of the display area AA. It can be designed according to actual needs in specific implementation.

It should be noted that FIG. 6 is only a schematic diagram of a cross-sectional structure of part of the display area AA of the display panel 100, which is not repeated herein. As for film layer structure of the display area AA of the display panel 100, FIG. 6 only shows an example, and reference may be made to the film layer structure of the display area AA of the organic light-emitting display panel in the related technologies for understanding, which is not repeated herein. The display panel 100 may include the base substrate 10, which may be fabricated using at least one of organic materials such as polyimide, polyethylene terephthalate, or polyurethane. The base substrate 10 fabricated using the organic materials such as polyimide, polyethylene terephthalate, or polyurethane has excellent thermal properties, mechanical properties, electrical properties, and dimensional stability, and has desirable film-forming properties, high optical transparency, and low moisture absorption rate, so that the fabricated base substrate 10 can have desirable planarization and adhesion performance. In some embodiments, the base substrate 10 can be fabricated to have two layers of flexible substrates, i.e., a first substrate and a second substrate (not shown in the figure). During a manufacturing process of the base substrate 10, film layers are usually fabricated layer by layer. For example, the first substrate is fabricated on a hard substrate first (can be fabricated by coating), and then the second substrate is fabricated, so as to enhance bending resistance of the base substrate 10, which is convenient for application in fabrication of a flexible display device.

In some embodiments, a driving circuit layer including a plurality of thin film transistors may also be provided within the range of the display area AA on the base substrate 10. Here is only an example to illustrate the film layer structure that the base substrate 10 may include, and during specific implementation, a design structure of the base substrate 10 includes but is not limited hereto and may also include other film layer structures. For example, as shown in FIG. 6, which is a schematic cross-sectional structural diagram along direction C-C' in FIG. 3, the display panel 100 includes the base substrate 10, a buffer layer 92 located at one side of the base substrate 10, a semiconductor active layer 210 located on the buffer layer 92, a first metal layer 202 located at one side of the semiconductor active layer 210 away from the base substrate 10, a capacitor metal layer 203 located at one side of the first metal layer 202 away from the substrate 10, a second metal layer 204 located at one side of the capacitor metal layer 203 away from the base substrate 10, and a third metal layer 205 located at one side of the second metal layer 204 away from the base substrate 10. The display panel 100 also includes a thin film transistor T and a light emission device 40 located at one side of the thin film transistor T away from the base substrate 10. The light emission device 40 includes an anode layer 410, a light emission layer 420 located at one side of the anode layer 410 away from the base substrate 10, and a cathode layer 430 located at one side of the light emission layer 420 away from the base substrate 10. The thin film transistor T includes a gate and source and drain electrodes, where the gate is located at the first metal layer 202, and the source and drain electrodes are located at the second metal layer 204. The third metal layer 205 is provided between the anode layer 410 and the source and drain electrodes. In some embodiments, the thin film transistor T is located on the buffer layer 92. In FIG. 6, only a top-gate thin film transistor is used as an example to illustrate the structure, and only one thin film transistor T is schematically shown herein. In an actual product, there is at least one thin film transistor corresponding to each pixel. For example, there are seven transistors and one storage capacitor if a pixel driving circuit is 7T1C. The thin film transistor T herein is only a schematic illustration of the film layers of the display panel 100. The thin film transistor T includes the semiconductor active layer 210 located on the buffer layer 92, and the semiconductor active layer 210 includes a source region and a drain region formed by doping N-type impurity ions or P-type impurity ions. A region between the source region and the drain region is a channel region in which no impurities are doped. The semiconductor active layer may be formed by changing amorphous silicon into polysilicon by crystallizing the amorphous silicon. The gate may include single or multiple layers of gold (Au), silver (Ag), copper (Cu), nickel (Ni), platinum (Pt), palladium (Pd), aluminum (Al), molybdenum (Mo), or chromium (Cr), or alloys such as aluminum (Al): neodymium (Nd) alloy, or molybdenum (Mo):tungsten (W) alloy. The source and drain electrodes are respectively electrically connected (or bonded) to the source region and the drain region of the semiconductor active layer 210 through contact holes formed by selectively removing insulating layers.

In some embodiments, an encapsulation layer 50 located at one side of the light emission device 40 away from the base substrate 10 is also shown in FIG. 6. The encapsulation layer 50 has a laminated structure of an inorganic encapsulation layer, an organic encapsulation layer, and an inorganic encapsulation layer. Specific structure of the encapsulation layer 50 is not limited in the present disclosure, and the encapsulation layer 50 may have multiple layers of inorganic encapsulation layers and multiple layers of organic encapsulation layers in some other embodiments, as long as the light emission device 40 within the display area AA can be well protected. The thin film transistor T drives the light emission device 40 to emit light for display.

In some embodiments, the display panel 100 is a flexible display panel 100, and the display panel 100 is bent in an area of a lower frame to a backlight side of the display panel 100. A cover plate 200 is provided at light emission side of the display panel 100, and the cover plate 200 protects the display panel 100. The cover plate 200 and the display panel 100 are connected by an optical glue 201. In some other embodiments, the cover plate 200 can be made larger on periphery of the display panel 100 so as to provide better protection. A first support layer 601 is provided at the backlight side of the display panel 100, and the composite adhesive layer 400 is provided at one side of the first support layer 601 away from the cover plate 200. A second support layer 602 is also provided at one side of the composite adhesive layer 400 away from the cover plate 200, and the second support layer 602 and the composite adhesive layer 400 are connected by a double-sided adhesive 603. The display panel 100 is bent and attached to back side of the second support layer 602, and then the flexible printed circuit 300 is bound to the display panel 100.

The flexible printed circuit (FPC) 300 is a highly reliable and excellent flexible printed circuit board made of polyimide or polyester film as a base material, which has characteristics of high wiring density, light weight, thin thickness, and desirable bendability. In the present disclosure, the display panel 100 is bent and attached to the back side of the second support layer 602, and then the flexible printed circuit 300 is bound to the display panel 100. In this structure, it is not needed to bind the flexible printed circuit 300 or a driver chip (not shown in the figure) to a lower step at the light emission side of the display panel 100, so that a narrow frame of the lower frame can be realized. The flexible printed circuit 300 includes at least one first conductive region 3001.

For the flexible display panel 100, its base substrate 10 is a flexible base substrate 10, so its edges are prone to bending, and its surface is also easily scratched. The first support layer 601 is provided at one side of the base substrate 10 of the display panel 100 away from the light emission surface, and the display panel 100 is bent and attached to the second support layer 602. On one hand, the edges of the base substrate 10 are prevented from bending so as to provide support. On the other hand, the base substrate 10 is also prevented from being scratched. In some embodiments, material of the first support layer 601 may be polyimide, and materials of the first support layer 601 and the second support layer 602 may be the same or different, which are not specifically limited herein.

The composite adhesive layer 400 is located at one side of the first support layer 601 away from the base substrate 10, which is configured to dissipate heat from the display panel 100, conduct the static electricity, and shield signals, thereby ensuring reliability of the display module 1000. Material of the composite adhesive layer 400 can be a conductive material or a metal material. In some embodiments, the composite adhesive layer 400 uses a super-composite-film (SCF) composited by foam, polyimide, and copper foil, which plays a role of heat dissipation, buffering, conduction, and protection.

In the present disclosure, the composite adhesive layer 400 includes at least one first through hole 4001 penetrating through the composite adhesive layer 400, and number of the first through holes 4001 can be one, two, three, or more than three, which is not specifically limited herein. In FIG. 3, one first through hole 4001 is taken as an example for schematic illustration, and in FIG. 4, four first through holes 4001 are taken as an example for schematic illustration. An orthographic projection of the first through hole 4001 on the plane where the base substrate 10 is located can be in a shape of a circle, a rectangle, an ellipse, etc., which is not specifically limited herein, as long as the first through hole 4001 penetrates through the composite adhesive layer 400 in the direction perpendicular to the plane where the base substrate 10 is located.

As shown in FIG. 5, the conductive structure 500 is at least partially located within the first through hole 4001. Along the direction perpendicular to the plane where the base substrate 10 of the display panel 100 is located, the length of the composite adhesive layer 400 H1 is less than or equal to the length of the conductive structure 500 H2. It can be understood that length of the conductive structure 500 in a direction of the plane where the base substrate 10 is located may be greater than or equal to thickness of the composite adhesive layer 400. To make the length of the composite adhesive layer 400 H1 being less than or equal to the length of the conductive structure 500 H2, part of the composite adhesive layer 400 can be thinned so that a surface of the flexible printed circuit 300 close to the composite adhesive layer 400 is attached to the composite adhesive layer 400. The flexible printed circuit 300 can also be bent so that the flexible printed circuit 300 is attached to one side of the first through hole 4001 away from the base substrate 10, which are not specifically limited herein, as long as it is ensured that the length of the composite adhesive layer 400 H1 is less than or equal to the length of the conductive structure 500 H2. In some embodiments, shape of the conductive structure 500 can be a cylinder, a prism, etc., and material of the conductive structure 500 is not specifically limited herein. In the present disclosure, function of the conductive structure 500 is to conduct the static electricity on the display panel 100 to the flexible printed circuit 300, so it is only required that the conductive structure 500 is a good conductor of charges. If a certain number of electrostatic charges are accumulated on the display panel 100, they will be directly conducted to the first conductive region 3001 of the flexible printed circuit 300 through the conductive structure 500 within the first through hole 4001, so that the electrostatic charges will not enter the display area AA of the display panel 100.

Compared with the related technologies, the display module 1000 consistent with the present disclosure has at least the following beneficial effects.

In the present disclosure, the composite adhesive layer 400 includes at least one first through hole 4001 penetrating through the composite adhesive layer 400, and the conductive structure 500 is at least partially located within the first through hole 4001. Along the direction perpendicular to the plane where the base substrate 10 of the display panel 100 is located, the length of the composite adhesive layer 400 H1 is less than or equal to the length of the conductive structure 500 H2. The flexible printed circuit 300 is electrically connected to the display panel 100, and the flexible printed circuit 300 includes at least one first conductive region 3001. The conductive structure 500 is electrically connected to the first conductive region 3001 of the flexible printed circuit 300. When external charges are accumulated on the display panel 100, for example, the charges enter from edges of the display panel 100 during cutting process or electrostatic test process, or enter from the edges of the display panel 100 after accumulated on the cover plate 200 of the display module 1000 due to friction and other reasons, since the composite adhesive layer 400 attached to the backlight side of the display panel 100 is provided with the first through hole 4001, and the first through hole 4001 is provided with the conductive structure 500, the charges will reach to the flexible printed circuit 300 that is electrically connected to the conductive structure 500 through the conductive structure 500. Also, the conductive structure 500 is electrically connected to the first conductive region 3001 of the flexible printed circuit 300, which prevents the charges from entering the display area AA of the display panel 100, and avoids the risks such as bright display around the screen, abnormal screen display or split screen phenomenon, decreased sensitivity or even failure, etc. caused by the charges entering the display area AA of the panel 100. Therefore, user experience of the display module 1000 is improved, service life of the display module 1000 is prolonged, and the display effect is improved.

Compared with the related technologies, in the present disclosure, since it is not needed to reserve a space in a bending area of the display panel 100 to arrange a conductive liquid or conductive silver paste 5003, there is no problem of insufficient avoidance space at a lower edge of the display module 1000, and width of the lower edge of the display module 1000 is not large, which is conducive to realizing the narrow frame.

Compared with the related technologies, in the present disclosure, it is only needed to arrange the first through hole 4001 at the composite adhesive layer 400 in original structure, and to arrange the conductive structure 500 within the first through hole 4001 so that the conductive structure 500 is electrically connected to the first conductive region 3001 of the flexible printed circuit 300. A fabrication method is relatively simple, operations are easy, and the product yield is high. However, in the related technologies, the conductive liquid or conductive silver paste 5003 is arranged at the lower edge of the display device, which has relatively high process requirements, and the yield loss is relatively high. Moreover, thickness and width of the display module 1000 are not increased in the present disclosure, which ensures thin and narrow frame of the display device while realizing electrostatic protection.

Figure 7:
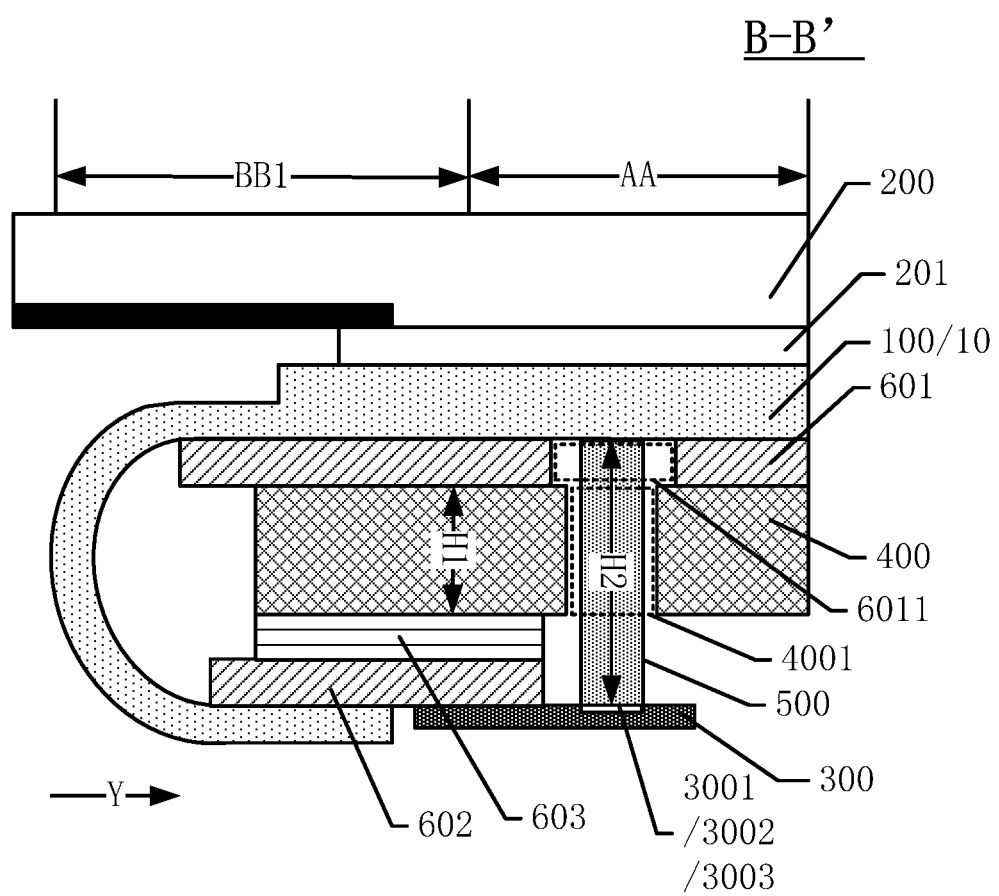
FIG. 7 is another cross-sectional view along direction B-B' in FIG. 3.

In some embodiments, referring to FIG. 7 which is another cross-sectional view along direction B-B' in FIG. 3, the display module 1000 consistent with the present disclosure also includes the first support layer 601, and the base substrate 10 is located at one side of the first support layer 601 close to the light emission surface of the display panel 100. At least one second through hole 6011 penetrating through the first support layer 601 is provided along the direction perpendicular to the plane where the base substrate 10 is located. The conductive structure 500 is at least partially located within the second through hole 6011, and is in contact with the first conductive region 3001 and the display panel 100 respectively. The first through hole 4001 and the second through hole 6011 at least partially overlap along the direction perpendicular to the plane where the base substrate 10 is located.

For the flexible display panel 100, its base substrate 10 is the flexible base substrate 10, so its edges are prone to bending, and its surface is also easily scratched. The first support layer 601 is provided at one side of the base substrate 10 of the display panel 100 away from the light emission surface. On one hand, the edges of the base substrate 10 are prevented from bending so as to provide support. On the other hand, the base substrate 10 is also prevented from being scratched. In some embodiments, the material of the first support layer 601 may be polyimide.

In some embodiments, at least one second through hole 6011 penetrating through the first support layer 601 is provided along the direction perpendicular to the plane where the base substrate 10 is located, and the second through hole 6011 is in the direction perpendicular to the plane where the base substrate 10 is located. Number of the second through hole 6011 can be one, two, three, or more than three, which is not specifically limited herein. In FIG. 3, one second through hole 6011 is taken as an example for schematic illustration. An orthographic projection of the second through hole 6011 on the plane where the base substrate 10 is located can be in a shape of a circle, a rectangle, an ellipse, etc., which is not specifically limited herein. The first through hole 4001 and the second through hole 6011 at least partially overlap along the direction perpendicular to the plane where the base substrate 10 is located. In FIG. 7, only that the orthographic projection of the second through hole 6011 on the plane where the base substrate 10 is located is larger than the orthographic projection of the first through hole 4001 on the plane where the base substrate 10 is located is taken as an example. The orthographic projection of the second through hole 6011 on the plane where the base substrate 10 is located may also be equal to or smaller than the orthographic projection of the first through hole 4001 on the plane where the base substrate 10 is located, which is not specifically limited herein, as long as the conductive structure 500 is at least partially located within the first through hole 4001 and the second through hole 6011, and the conductive structure 500 is in contact with the first conductive region 3001 and the display panel 100 respectively.

In some embodiments, the conductive structure 500 is not only partially located within the first through hole 4001, but also partially located within the second through hole 6011, so the length of the conductive structure 500 in the direction perpendicular to the plane where the base substrate 10 is located is greater than the length of the composite adhesive layer 400 in the direction perpendicular to the plane where the base substrate 10 is located.

In some embodiments, since the conductive structure 500 is directly in contact with the first conductive region 3001 and the display panel 100, the charges accumulated on the display panel 100 can be directly and quickly conducted to the first conductive region 3001 of the flexible printed circuit 300 through the second through the conductive structure 500 provided in the first through hole 4001 and the second through hole 6011. Therefore, the charges are prevented from entering the display area AA of the display panel 100 more effectively.

Figure 8:
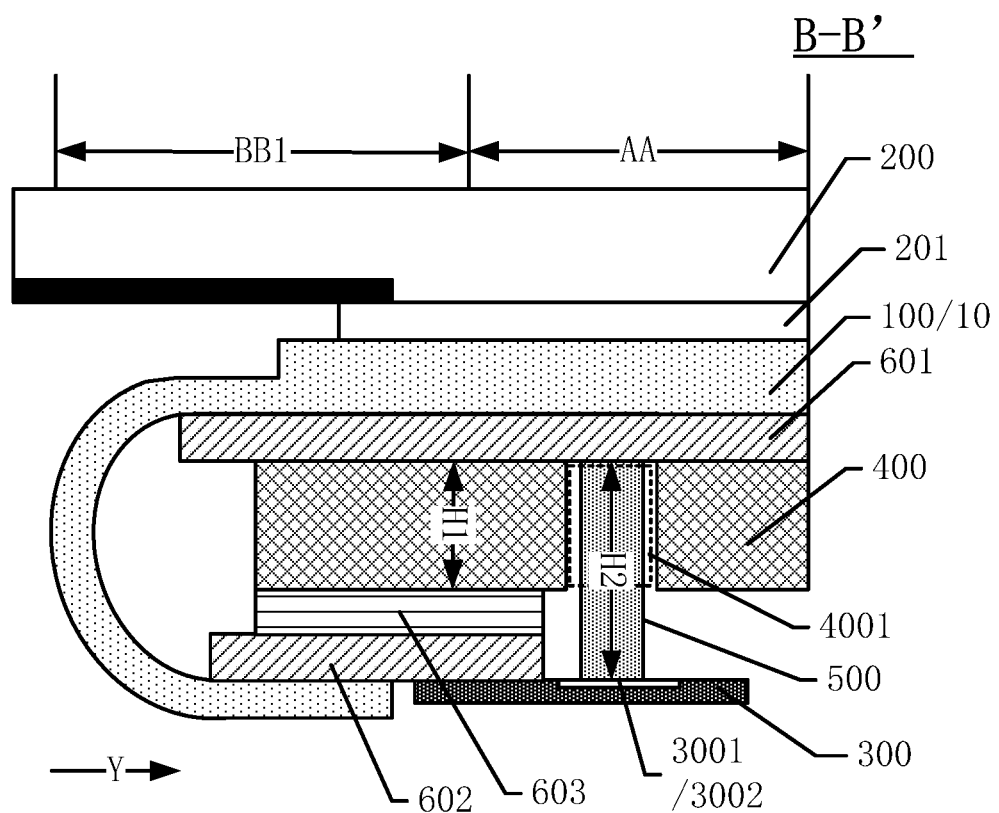
FIG. 8 is another cross-sectional view along direction B-B' in FIG. 3.

In some embodiments, referring to FIG. 8 which is another cross-sectional view along direction B-B' in FIG. 3, an orthographic projection of the conductive structure 500 on the plane where the base substrate 10 is located is within an orthographic projection of the first conductive region 3001 on the plane where the base substrate 10 is located.

In some embodiments, the display panel 100 is bent and attached to the second support layer 602 in the area of the lower frame, and a bending radius in a bending process may have a process error, so there is also a certain error in a corresponding position when the flexible printed circuit is bound to the display panel 100. The orthographic projection of the conductive structure 500 on the plane where the base substrate 10 is located is within the orthographic projection of the first conductive region 3001 on the plane where the base substrate 10 is located, i.e., an area of the first conductive region 3001 is larger than an area of the orthographic projection of the conductive structure 500. Therefore, even there is a certain error after the display panel 100 is bent, it is still ensured that the conductive structure 500 is electrically connected to the first conductive region 3001, which prevents the charges from entering the display area AA of the display panel 100.

In some embodiments, referring to FIGS. 5, 7, and 8, the first conductive region 3001 includes a leaked copper 3002.

Since the flexible printed circuit 300 is to be soldered to ground, a certain part of copper of the flexible printed circuit 300 needs to be exposed, that is, this part of the copper does not need protective paint, and is usually covered with green oil to expose the copper itself. Since the leaked copper 3002 on the flexible printed circuit 300 itself needs to be grounded, there is no need to additionally provide a grounding area on the flexible printed circuit 300. It is only needed to connect the conductive structure 500 to the leaked copper 3002 that itself needs to be grounded, and the charges accumulated on the display panel 100 can be conducted to the ground through the leaked copper 3002, which prevents the charges from entering the display area AA of the display panel 100.

In some embodiments, referring to FIGS. 5, 7, and 8, the conductive structure 500 includes a conductive double-sided adhesive 5001.

It can be understood that the conductive structure 500 needs to be a desirable conductor of charges so that the charges accumulated on the display panel 100 can be conducted to the first conductive region 3001 of the flexible printed circuit 300 through the conductive structure 500. After the flexible printed circuit 300 is bound to the display panel 100, some parts will protrude from the display panel 100. The flexible printed circuit 300 is unstable, i.e., the flexible printed circuit 300 is easy to bend, which affects signal transmission of the flexible printed circuit 300, and the reliability of the display module 1000 is compromised.

The conductive double-sided adhesive 5001 is an adhesive with certain conductivity after cured or dried, which can connect various conductive materials together to form electrical paths among connected materials. Conductive adhesive includes resin matrix, conductive particles and dispersing additives, auxiliary agents, etc. Before the conductive double-sided adhesive 5001 is cured or otherwise solidified (e.g., by a drying process), the conductive particles are separated in the adhesive, and there is no continuous contact with each other, so they are in an insulating state. After the conductive adhesive is cured or dried, volume of the adhesive shrinks due to volatilization of solvent and curing of the adhesive, so that the conductive particles are in a stable continuous state with each other, thus showing conductivity. If the conductive structure 500 includes the conductive double-sided adhesive 5001, then one side of the conductive double-sided adhesive 5001 close to the cover plate 200 can be bonded to back of the first support layer 601, and one side of the conductive double-sided adhesive 5001 close to the flexible printed circuit 300 can be bonded to the flexible printed circuit 300; or one side of the conductive double-sided adhesive 5001 close to the cover plate 200 can be bonded to the backlight side of the display panel 100, and one side of the conductive double-sided adhesive 5001 close to the flexible printed circuit 300 can be bonded to the flexible printed circuit 300. Therefore, the flexible printed circuit 300 can be fixed to the back of the first support layer 601 (in FIGS. 5 and 8) or to the backlight side of the display panel 100. In some embodiments, the conductive structure 500 includes the conductive double-sided adhesive 5001, which can not only realize a function of conducting the charges to the first conductive region 3001 of the flexible printed circuit 300, but also play a role of fixing the flexible printed circuit 300. Therefore, the reliability of the display module 1000 can be improved at this time.

Figure 9:
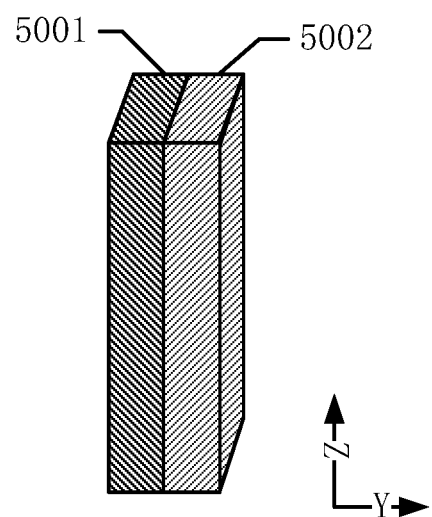
FIG. 9 is a structural schematic diagram of a conductive structure according to an embodiment of the present disclosure.

In some embodiments, referring to FIG. 9 in combination with FIGS. 5, 7, and 8, where FIG. 9 is a structural schematic diagram of a conductive structure according to an embodiment of the present disclosure, the conductive structure 500 includes the conductive double-sided adhesive 5001 and a conductive metal layer 5002.

As shown in FIG. 9, the conductive structure 500 is only schematically illustrated as a quadrangular prism structure. The conductive double-sided adhesive 5001 and the conductive metal layer 5002 are arranged in parallel along the second direction Y and extend along a third direction Z, where the third direction Z is the direction perpendicular to the plane where the base substrate 10 is located. Since the conductive double-sided adhesive 5001 has adhesiveness, the conductive double-sided adhesive 5001 and the conductive metal layer 5002 are fixedly connected. An arrangement relationship between the conductive double-sided adhesive tape 5001 and the conductive metal layer 5002 is not specifically limited herein.

It can be understood that although the conductive double-sided adhesive 5001 has both adhesiveness and conductivity, the conductivity thereof is not as good as that of the conductive metal layer 5002. In some embodiments, the charges accumulated on the display panel 100 need to be quickly conducted to the first conductive region 3001 of the flexible printed circuit 300, so the conductive metal layer 5002 provided in the conductive structure 500 can realize fast conduction of the electrostatic charges. In some embodiments, the conductive structure 500 also includes the conductive double-sided adhesive 5001, which can not only realize the function of conducting the charges to the first conductive region 3001 of the flexible printed circuit 300, but also play a role of fixing the flexible printed circuit 300. Therefore, the reliability of the display module 1000 can be improved at this time.

Figure 10:
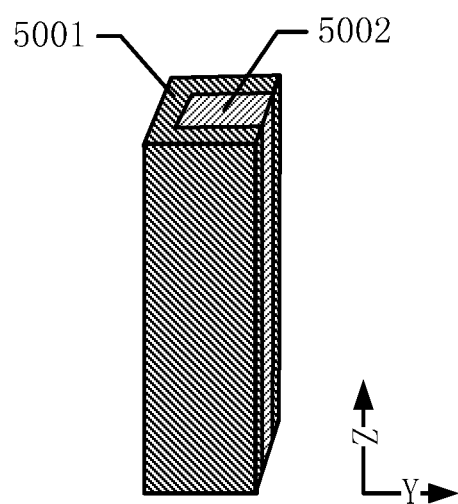
FIG. 10 is a structural schematic diagram of another conductive structure according to an embodiment of the present disclosure.
Figure 11:
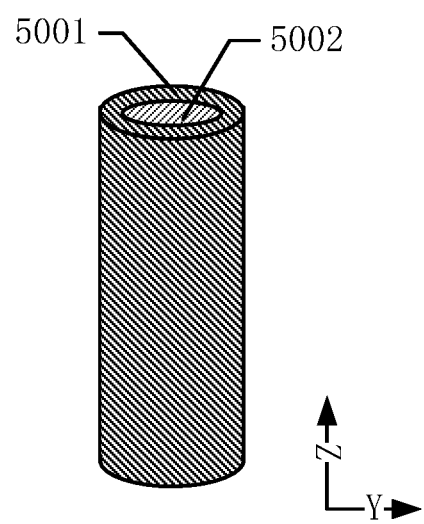
FIG. 11 is a structural schematic diagram of another conductive structure according to an embodiment of the present disclosure.

In some embodiments, referring to FIGS. 10 and 11 in combination with FIGS. 5, 7, and 8, where FIG. 10 is a structural schematic diagram of another conductive structure according to an embodiment of the present disclosure, and FIG. 11 is a structural schematic diagram of another conductive structure according to an embodiment of the present disclosure, within the orthographic projection of the conductive structure 500 on the plane where the base substrate 10 is located, the conductive double-sided adhesive 5001 at least partially surrounds the conductive metal layer 5002.

FIG. 10 is only a schematic illustration in which the conductive structure 500 is a prism, and the conductive double-sided adhesive 5001 partially surrounds the conductive metal layer 5002 within the orthographic projection of the conductive structure 500 on the plane where the base substrate 10 is located. In FIG. 10, within the orthographic projection of the conductive structure 500 on the plane where the substrate 10 is located, the conductive double-sided adhesive 5001 is a groove structure, and the conductive metal layer 5002 is located in the groove structure. FIG. 10 is only one of the embodiments in which the conductive double-sided adhesive 5001 partially surrounds the conductive metal layer 5002 within the orthographic projection of the conductive structure 500 on the plane where the base substrate 10 is located, which is not specifically limited herein. FIG. 11 is only a schematic illustration in which the conductive structure 500 is cylindrical, and the conductive double-sided adhesive 5001 completely surrounds the conductive metal layer 5002 within the orthographic projection of the conductive structure 500 on the plane where the base substrate 10 is located. Thickness of the conductive double-sided adhesive 5001 in the second direction Y is not specifically limited herein.

In some embodiments, within the orthographic projection of the conductive structure 500 on the plane where the base substrate 10 is located, the conductive double-sided adhesive 5001 at least partially surrounds the conductive metal layer 5002, and the conductive double-sided adhesive 5001 can not only realize the function of conducting the charges to the first conductive region 3001 of the flexible printed circuit 300, but also play a role of fixing the flexible printed circuit 300. Therefore, the reliability of the display module 1000 can be improved at this time. The conductive metal layer 5002 is provided in the conductive structure 500. One side of the conductive metal layer 5002 close to the base substrate 10 is in contact with the first support layer 601 or the display panel 100, and one side of the conductive metal layer 5002 close to the flexible printed circuit 300 is in contact with the flexible printed circuit 300. Since the conductive metal layer 5002 has desirable conductivity, the charges accumulated on the display panel 100 can be quickly and directly conducted to the first conductive region 3001 of the flexible printed circuit 300.

Figure 12:
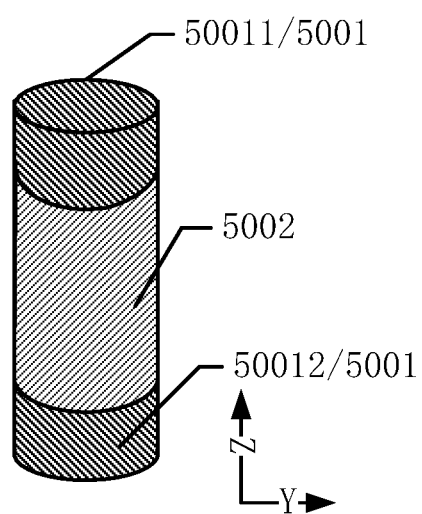
FIG. 12 is a structural schematic diagram of another conductive structure according to an embodiment of the present disclosure.

In some embodiments, referring to FIG. 12 in combination with FIGS. 5, 7, and 8, where FIG. 12 is a structural schematic diagram of another conductive structure according to an embodiment of the present disclosure, along the direction perpendicular to the plane where the base substrate 10 is located, the conductive structure 500 includes a first conductive double-sided adhesive 50011, the conductive metal layer 5002 located at one side of the first conductive double-sided adhesive 50011 close to the display panel 100, and a second conductive double-sided adhesive 50012 located at one side of the conductive metal layer 5002 close to the display panel 100.

The conductive structure 500 is a sandwich structure, including the first conductive double-sided adhesive 50011, the conductive metal layer 5002, and the second conductive double-sided adhesive 50012. Along the direction perpendicular to the plane where the base substrate 10 is located, the conductive metal layer 5002 is sandwiched between the first conductive double-sided adhesive 50011 and the second conductive double-sided adhesive 50012, and the first conductive double-sided adhesive 50011 is located at one side of the conductive structure 500 close to the display panel 100. Materials of the first conductive double-sided adhesive 50011 and the second conductive double-sided adhesive 50012 may be the same or different, and are not specifically limited herein. Combined with FIGS. 5 and 8, the first conductive double-sided adhesive 50011 is bonded to one side of the first support layer 601 away from the base substrate 10, and the second conductive double-sided adhesive 50012 is bonded to the first conductive region 3001 of the flexible printed circuit 300. Combined with FIG. 7, the first conductive double-sided adhesive 50011 is bonded to the backlight surface of the display panel 100, and the second conductive double-sided adhesive 50012 is bonded to the first conductive region 3001 of the flexible printed circuit 300.

In some embodiments, the charges accumulated on the display panel 100 are conducted to the first conductive region 3001 of the flexible printed circuit 300 through the first conductive double-sided adhesive 50011, the conductive metal layer 5002, and the second conductive double-sided adhesive 50012. The first conductive double-sided adhesive 50011 and the second conductive double-sided adhesive 50012 can play a dual role of conduction and fixing, and the conductive metal layer 5002 between the first conductive double-sided adhesive 50011 and the second conductive double-sided adhesive 50012 can speed up the conduction of charges.

Figure 13:
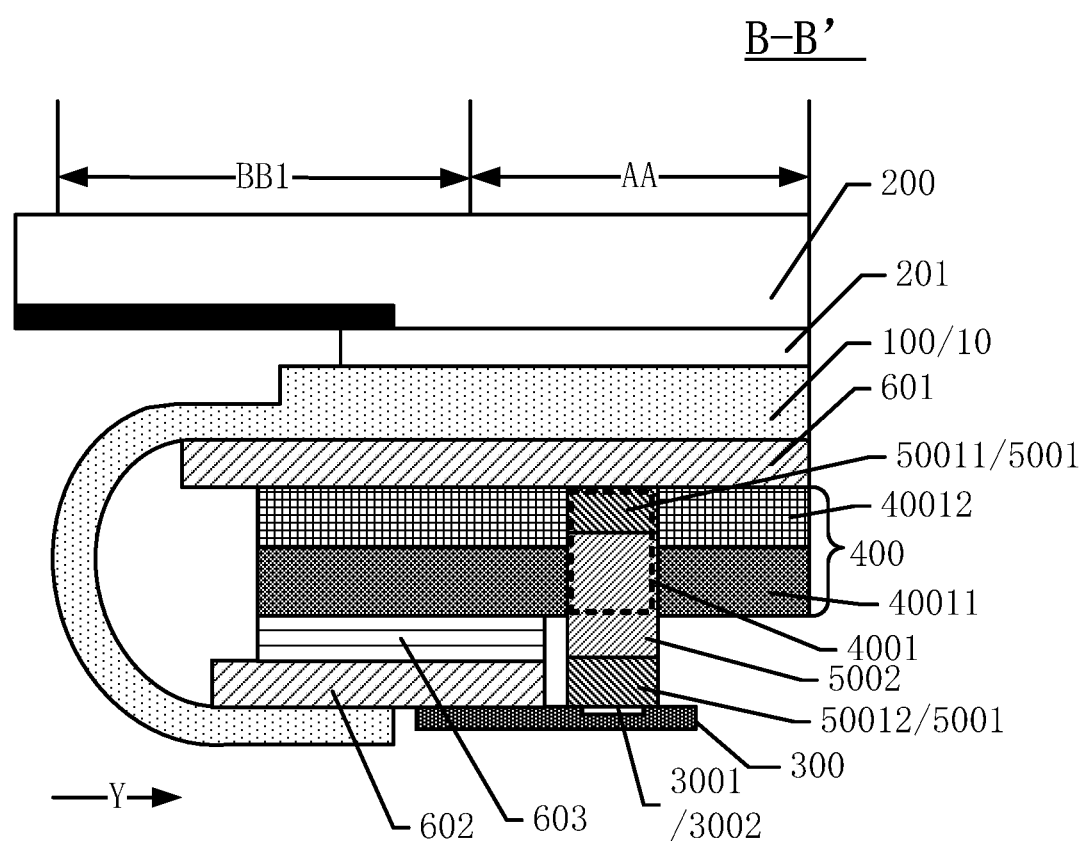
FIG. 13 is another cross-sectional view along direction B-B' in FIG. 3.
Figure 14:
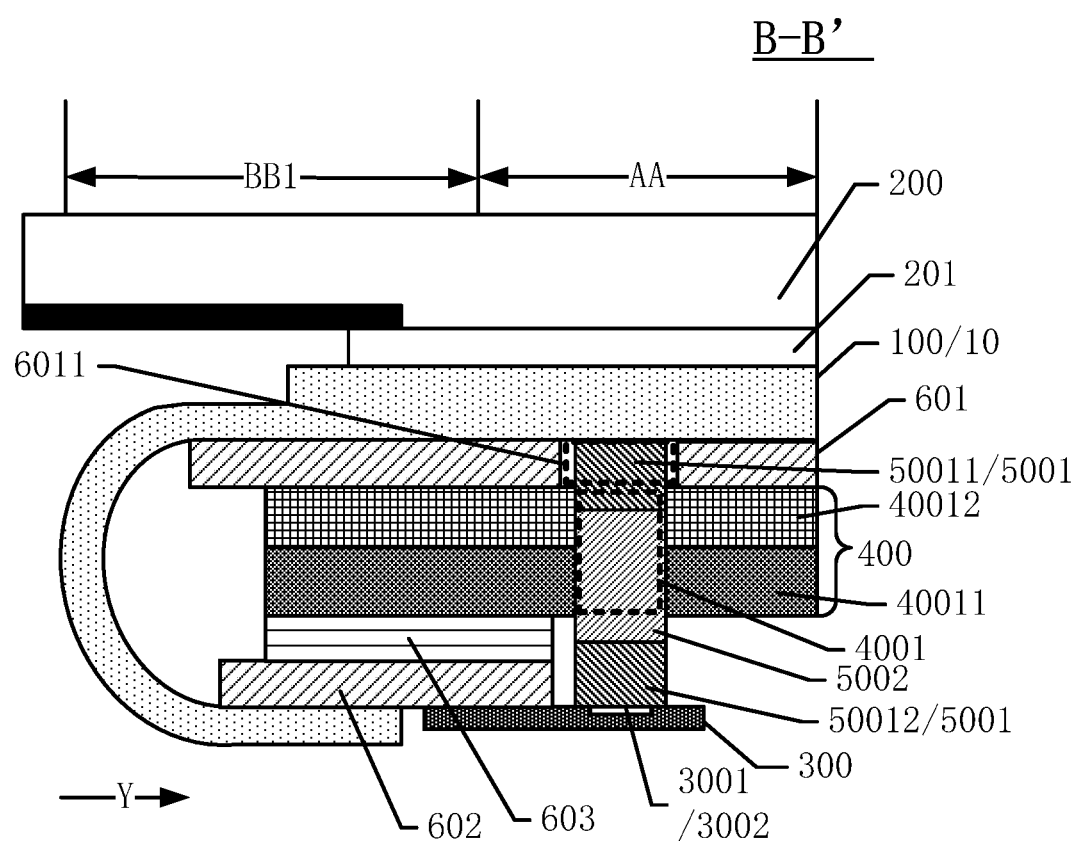
FIG. 14 is another cross-sectional view along direction B-B' in FIG. 3.

In some embodiments, referring to FIGS. 13 and 14, where FIG. 13 is another cross-sectional view along direction B-B' in FIG. 3, and FIG. 14 is another cross-sectional view along direction B-B' in FIG. 3, the composite adhesive layer 400 includes a metal layer 40011, and the conductive structure 500 is in contact with the metal layer 40011.

In FIG. 13, the composite adhesive layer 400 includes the first through hole 4001, and the conductive structure 500 is partially located within the first through hole 4001. In FIG. 14, the composite adhesive layer 400 includes the first through hole 4001, and the first support layer 601 includes the second through hole 6011, where the conductive structure 500 is partially located within the first through hole 4001 and the second through hole 6011. In some embodiments, the composite adhesive layer 400 includes the metal layer 40011. As described above, the composite adhesive layer 400 plays a role of dissipating heat from the display panel 100, conducting the static electricity, and shielding signals, so the metal layer 40011 herein plays a role of conducting the static electricity and shielding signals.

The conductive structure 500 is a sandwich structure, including the first conductive double-sided adhesive 50011, the conductive metal layer 5002, and the second conductive double-sided adhesive 50012. Along the direction perpendicular to the plane where the base substrate 10 is located, the conductive metal layer 5002 is sandwiched between the first conductive double-sided adhesive 50011 and the second conductive double-sided adhesive 50012, and the first conductive double-sided adhesive 50011 is located at one side of the conductive structure 500 close to the display panel 100. The conductive metal layer 5002 in the conductive structure 500 is in contact with the metal layer 40011 in the composite adhesive layer 400, and the metal layer 40011 itself plays a role of electrostatic conduction. Therefore, a part of the charges accumulated on the display panel 100 can also be conducted to the composite adhesive layer 400 through the conductive structure 500, i.e., a conduction path of the charges is from the first conductive double-sided adhesive 50011 to the conductive metal layer 5002, and then to the metal layer 40011 of the composite adhesive layer 400. As a result, the conduction path of the charges is increased, which can further prevent the charges from entering the display area AA of the display panel 100, and further reduce the risks such as bright display around the screen, abnormal screen display or split screen phenomenon, decreased sensitivity or even failure, etc.

Figure 15:
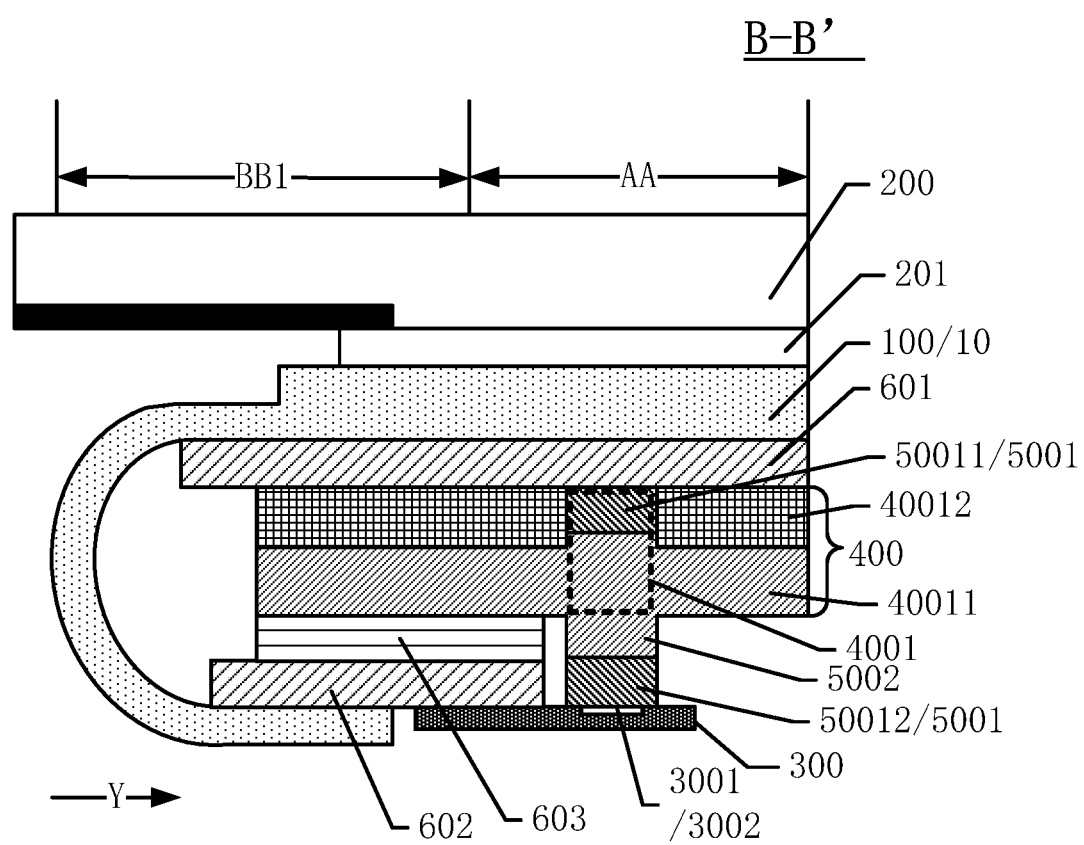
FIG. 15 is another cross-sectional view along direction B-B' in FIG. 3.

In some embodiments, referring to FIG. 15 which is another cross-sectional view along direction B-B' in FIG. 3, the composite adhesive layer 400 includes the metal layer 40011, and the metal layer 40011 and the conductive metal layer 5002 are integrally structured into a single piece.

In some embodiments, the composite adhesive layer 400 includes the metal layer 40011. As described above, the composite adhesive layer 400 plays a role of dissipating heat from the display panel 100, conducting the static electricity, and shielding signals, so the metal layer 40011 herein plays a role of conducting the static electricity and shielding signals. On one hand, the metal layer 40011 and the conductive metal layer 5002 are integrated structured, and the metal layer 40011 itself plays a role of electrostatic conduction. Therefore, a part of the charges accumulated on the display panel 100 can also be conducted to the composite adhesive layer 400 through the conductive structure 500, i.e., the conduction path of the charges is from the first conductive double-sided adhesive 50011 to the conductive metal layer 5002, and then to the metal layer 40011 of the composite adhesive layer 400. As a result, the conduction path of the charges is increased, which can further prevent the charges from entering the display area AA of the display panel 100. On the other hand, since the metal layer 40011 and the conductive metal layer 5002 are integrally structured into a single piece, the conductive metal layer 5002 in the conductive structure 500 and the metal layer 40011 in the composite adhesive layer 400 can be fabricated at the same time, which is conducive to simplifying fabrication process. In some other embodiments, if thickness of the conductive metal layer 5002 in the direction perpendicular to the plane where the base substrate 10 is located is equal to thickness of the metal layer 40011 in the composite adhesive layer 400 in the direction perpendicular to the plane where the base substrate 10 is located, it is more conducive to simplifying the fabrication process.

In some embodiments, referring to FIGS. 13-15, material of the metal layer 40011 is copper.

The composite adhesive layer 400 plays a role of dissipating heat from the display panel 100, conducting the static electricity, and shielding signals, and the metal layer 40011 plays a role of conducting the static electricity and shielding signals. The material of the metal layer 40011 includes copper that is a good conductor, which can play a role of conducting the static electricity and shielding signals. In some embodiments, the metal layer 40011 is in contact with the conductive metal layer 5002, or the metal layer 40011 and the conductive metal layer 5002 are integrally structured into a single piece. Therefore, a part of the accumulated charges on the display panel 100 can be conducted to the metal layer 40011 more quickly, which further prevents the charges from entering the display area AA of the display panel 100.

Figure 16:
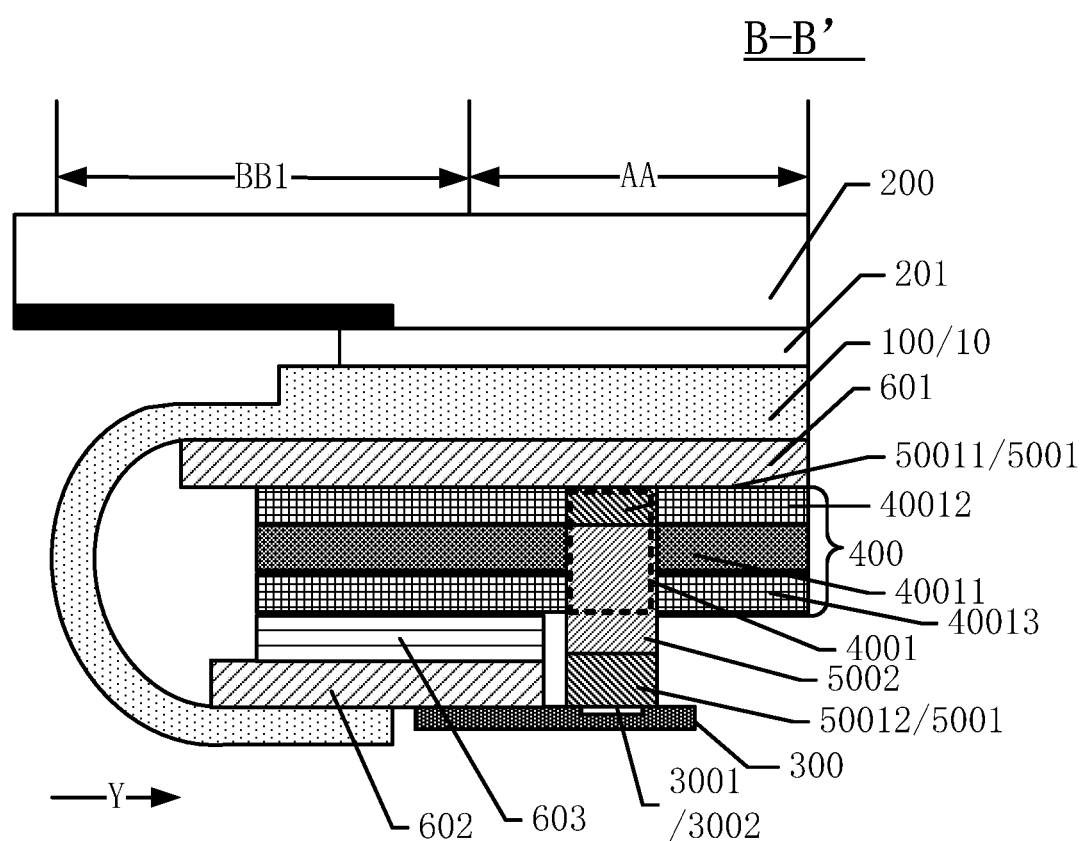
FIG. 16 is another cross-sectional view along direction B-B' in FIG. 3.

In some embodiments, referring to FIG. 16 which is another cross-sectional view along direction B-B' in FIG. 3, the composite adhesive layer 400 also includes a first foam layer 40012 and a second foam layer 40013. The first foam layer 40012 is located at one side of the metal layer close to the display panel 100, and the second foam layer 40013 is located at one side of the metal layer away from the second foam layer 40013.

In some embodiments, the composite adhesive layer 400 uses the super-composite-film (SCF) composited by foam, polyimide, and copper foil, which plays a role of heat dissipation, buffering, conduction, and protection. The copper foil plays a role of conduction and heat dissipation for the metal layer, while the foam plays a role of buffering and protection. A one-layer structure can be used for the foam, for example, only one layer of the first foam layer 40012 is provided in FIGS. 13-15. In some other embodiments, the composite adhesive layer 400 is a sandwich structure, and the metal layer is sandwiched between the first foam layer 40012 and the second foam layer 40013. A double-layer foam structure can play a better role of buffering and protection of the display panel 100.

Figure 17:
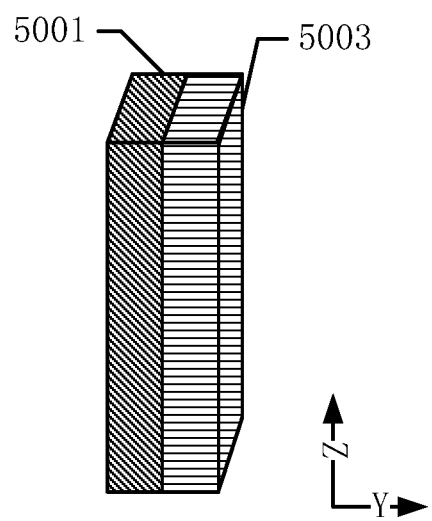
FIG. 17 is a structural schematic diagram of another conductive structure according to an embodiment of the present disclosure.

In some embodiments, referring to FIG. 17 in combination with FIGS. 5, 7, and 8, where FIG. 17 is a structural schematic diagram of another conductive structure according to an embodiment of the present disclosure, the conductive structure 500 includes the conductive double-sided adhesive 5001 and the silver paste 5003.

The silver paste 5003 is a conductive material, which is prepared from silver or its compound, flux, adhesive, and thinner. The silver paste 5003 is solid after being fabricated into the conductive structure 500, and conductivity of the silver paste 5003 is positively correlated with silver content therein. During a process of fabricating the conductive structure 500, the silver paste 5003 can be coated on the conductive double-sided adhesive 5001 and then cured.

As shown in FIG. 17, the conductive structure 500 is only schematically illustrated as a quadrangular prism structure. The conductive double-sided adhesive 5001 and the silver paste 5003 are arranged in parallel along the second direction Y and extend along the third direction Z, where the third direction Z is the direction perpendicular to the plane where the base substrate 10 is located. Since the conductive double-sided adhesive 5001 has adhesiveness, and the silver paste 5003 also has a certain viscosity, so the conductive double-sided adhesive 5001 and the silver paste 5003 are fixedly connected. An arrangement relationship between the conductive double-sided adhesive tape 5001 and the silver paste 5003 is not specifically limited herein.

As described above, the conductive structure 500 needs to be a desirable conductor of charges so that the charges accumulated on the display panel 100 can be conducted to the first conductive region 3001 of the flexible printed circuit 300 through the conductive structure 500. After the flexible printed circuit 300 is bound to the display panel 100, some parts will protrude from the display panel 100. The flexible printed circuit 300 is unstable, i.e., the flexible printed circuit 300 is easy to bend, which affects the signal transmission of the flexible printed circuit 300, and the reliability of the display module 1000 is compromised. The conductive double-sided adhesive 5001 is an adhesive with certain conductivity after cured or dried, which can connect various conductive materials together to form electrical paths among connected materials. If the conductive structure 500 includes the conductive double-sided adhesive 5001, then one side of the conductive double-sided adhesive 5001 close to the cover plate 200 can be bonded to back of the first support layer 601, and one side of the conductive double-sided adhesive 5001 close to the flexible printed circuit 300 can be bonded to the flexible printed circuit 300; or one side of the conductive double-sided adhesive 5001 close to the cover plate 200 can be bonded to the backlight side of the display panel 100, and one side of the conductive double-sided adhesive 5001 close to the flexible printed circuit 300 can be bonded to the flexible printed circuit 300. Therefore, the flexible printed circuit 300 can be fixed to the back of the first support layer 601 or to the backlight side of the display panel 100.

Although the conductive double-sided adhesive 5001 has both adhesiveness and conductivity, the conductivity thereof is not as good as that of the silver paste 5003. In some embodiments, the charges accumulated on the display panel 100 need to be quickly conducted to the first conductive region 3001 of the flexible printed circuit 300, so the silver paste 5003 provided in the conductive structure 500 can realize fast conduction of the electrostatic charges. In some embodiments, the conductive structure 500 also includes the conductive double-sided adhesive 5001, which can not only realize the function of conducting the charges to the first conductive region 3001 of the flexible printed circuit 300, but also play a role of fixing the flexible printed circuit 300. Therefore, the reliability of the display module 1000 can be improved at this time.

Figure 18:
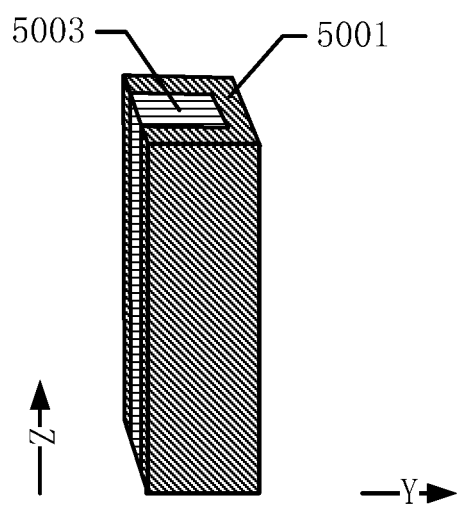
FIG. 18 is a structural schematic diagram of another conductive structure according to an embodiment of the present disclosure.
Figure 19:
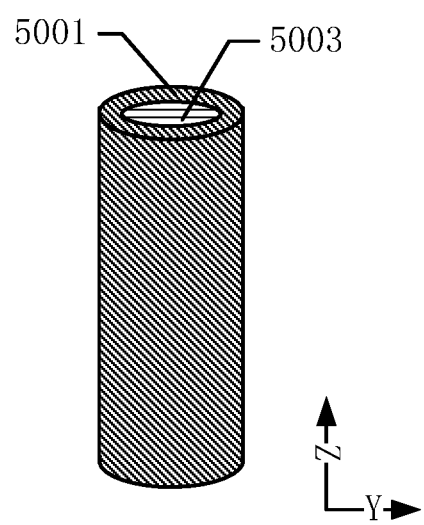
FIG. 19 is a structural schematic diagram of another conductive structure according to an embodiment of the present disclosure.

In some embodiments, referring to FIGS. 18 and 19 in combination with FIGS. 5, 7, and 8, where FIG. 18 is a structural schematic diagram of another conductive structure according to an embodiment of the present disclosure, and FIG. 19 is a structural schematic diagram of another conductive structure according to an embodiment of the present disclosure, within the orthographic projection of the conductive structure 500 on the plane where the base substrate 10 is located, the conductive double-sided adhesive 5001 at least partially surrounds the silver paste 5003.

FIG. 18 is only a schematic illustration in which the conductive structure 500 is a prism, and the conductive double-sided adhesive 5001 partially surrounds the silver paste 5003 within the orthographic projection of the conductive structure 500 on the plane where the base substrate 10 is located. In FIG. 18, within the orthographic projection of the conductive structure 500 on the plane where the substrate 10 is located, the conductive double-sided adhesive 5001 is a groove structure, and the silver paste 5003 is located in the groove structure. FIG. 18 is only one of the embodiments in which the conductive double-sided adhesive 5001 partially surrounds the silver paste 5003 within the orthographic projection of the conductive structure 500 on the plane where the base substrate 10 is located, which is not specifically limited herein. FIG. 19 is only a schematic illustration in which the conductive structure 500 is cylindrical, and the conductive double-sided adhesive 5001 completely surrounds the silver paste 5003 within the orthographic projection of the conductive structure 500 on the plane where the base substrate 10 is located. The thickness of the conductive double-sided adhesive 5001 in the second direction Y is not specifically limited herein.

In some embodiments, within the orthographic projection of the conductive structure 500 on the plane where the base substrate 10 is located, the conductive double-sided adhesive 5001 at least partially surrounds the silver paste 5003, and the conductive double-sided adhesive 5001 can not only realize the function of conducting the charges to the first conductive region 3001 of the flexible printed circuit 300, but also play a role of fixing the flexible printed circuit 300. Therefore, the reliability of the display module 1000 can be improved at this time. The silver paste 5003 is provided in the conductive structure 500. One side of the silver paste 5003 that is close to the base substrate 10 is in contact with the first support layer 601 or the display panel 100, and one side of the silver paste 5003 that is close to the flexible printed circuit 300 is in contact with the flexible printed circuit 300. Since the silver paste 5003 has desirable conductivity, the charges accumulated on the display panel 100 can be quickly and directly conducted to the first conductive region 3001 of the flexible printed circuit 300.

Figure 20:
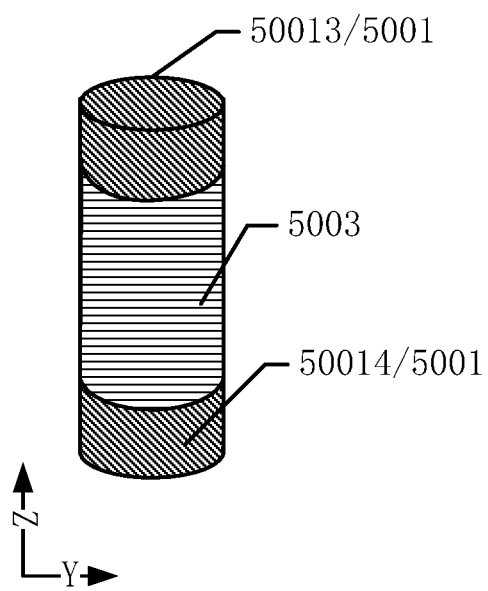
FIG. 20 is a structural schematic diagram of another conductive structure according to an embodiment of the present disclosure.

In some embodiments, referring to FIG. 20 in combination with FIGS. 5, 7, and 8, where FIG. 20 is a structural schematic diagram of another conductive structure according to an embodiment of the present disclosure, along the direction perpendicular to the plane where the base substrate 10 is located, the conductive structure 500 includes a third conductive double-sided adhesive 50013, the silver paste 5003 located at one side of the third conductive double-sided adhesive 50013 close to the display panel 100, and a fourth conductive double-sided adhesive 50014 located at one side of the silver paste 5003 close to the display panel 100.

The conductive structure 500 is a sandwich structure, including the third conductive double-sided adhesive 50013, the silver paste 5003, and the fourth conductive double-sided adhesive 50014. Along the direction perpendicular to the plane where the base substrate 10 is located, the silver paste 5003 is sandwiched between the third conductive double-sided adhesive 50013 and the fourth conductive double-sided adhesive 50014, and the third conductive double-sided adhesive 50013 is located at one side of the conductive structure 500 close to the display panel 100. Materials of the third conductive double-sided adhesive 50013 and the fourth conductive double-sided adhesive 50014 may be the same or different, and are not specifically limited herein. Combined with FIGS. 5 and 8, the third conductive double-sided adhesive 50013 is bonded to one side of the first support layer 601 away from the base substrate 10, and the fourth conductive double-sided adhesive 50014 is bonded to the first conductive region 3001 of the flexible printed circuit 300. Combined with FIG. 7, the third conductive double-sided adhesive 50013 is bonded to the backlight surface of the display panel 100, and the fourth conductive double-sided adhesive 50014 is bonded to the first conductive region 3001 of the flexible printed circuit 300.

In some embodiments, the charges accumulated on the display panel 100 are conducted to the first conductive region 3001 of the flexible printed circuit 300 through the third conductive double-sided adhesive 50013, the silver paste 5003, and the fourth conductive double-sided adhesive 50014. The third conductive double-sided adhesive 50013 and the fourth conductive double-sided adhesive 50014 can play a dual role of conduction and fixing, and the silver paste 5003 between the third conductive double-sided adhesive 50013 and the fourth conductive double-sided adhesive 50014 can speed up the conduction of charges.

In some embodiments, referring to FIG. 5, the first conductive region 3001 includes a first metal sheet 3003, and the first metal sheet 3003 is made of copper.

It can be understood that the first conductive region 3001 includes the first metal sheet 3003, and the first metal sheet 3003 is copper which is a good conductor of charges. Therefore, the charges accumulated on the display panel 100 can be conducted to the first metal sheet 3003 in the first conductive region 3001, which prevents the charges from entering the display area AA of the display panel 100.

In some embodiments, referring to FIGS. 3-20, the first conductive region 3001 is grounded, connected to a positive voltage, or electrically connected to an electrostatic circuit.

In some embodiments, the first conductive region 3001 is grounded. Since the composite adhesive layer 400 attached to the backlight side of the display panel 100 is provided with the first through hole 4001, and the first through hole 4001 is provided with the conductive structure 500, the charges will reach to the flexible printed circuit 300 that is electrically connected to the conductive structure 500 through the conductive structure 500. Also, the conductive structure 500 is electrically connected to the first conductive region 3001 of the flexible printed circuit 300. The first conductive region 3001 is grounded, and the charges are directly conducted to the ground, which prevents the charges from entering the display area AA of the display panel 100, and avoids the risks such as bright display around the screen, abnormal screen display or split screen phenomenon, decreased sensitivity or even failure, etc. caused by the charges entering the display area AA of the panel 100. Therefore, the user experience of the display module 1000 is improved, the service life of the display module 1000 is prolonged, and the display effect is improved.

In some embodiments, the first conductive region 3001 is connected to a positive voltage. The composite adhesive layer 400 attached to the backlight side of the display panel 100 is provided with the first through hole 4001, and the first through hole 4001 is provided with the conductive structure 500. The electrostatic charges are generally negative charges, which will reach to the flexible printed circuit 300 that is electrically connected to the conductive structure 500 through the conductive structure 500. Also, the conductive structure 500 is electrically connected to the first conductive region 3001 of the flexible printed circuit 300. The first conductive region 3001 is connected to a positive voltage, and the negative charge cancels out the positive voltage of the first conductive region 3001, which fundamentally eliminates the electrostatic charges accumulated on the display panel 100.

In some embodiments, the first conductive region 3001 is electrically connected to an electrostatic circuit (not shown in the figure). Since the composite adhesive layer 400 attached to the backlight side of the display panel 100 is provided with the first through hole 4001, and the first through hole 4001 is provided with the conductive structure 500, the charges will reach to the flexible printed circuit 300 that is electrically connected to the conductive structure 500 through the conductive structure 500. Also, the conductive structure 500 is electrically connected to the first conductive region 3001 of the flexible printed circuit 300. The first conductive region 3001 is electrically connected to the electrostatic circuit, which can play a role of electrostatic protection, so that the charges are conducted and prevented from entering the display area AA of the display panel 100.

Figure 21:
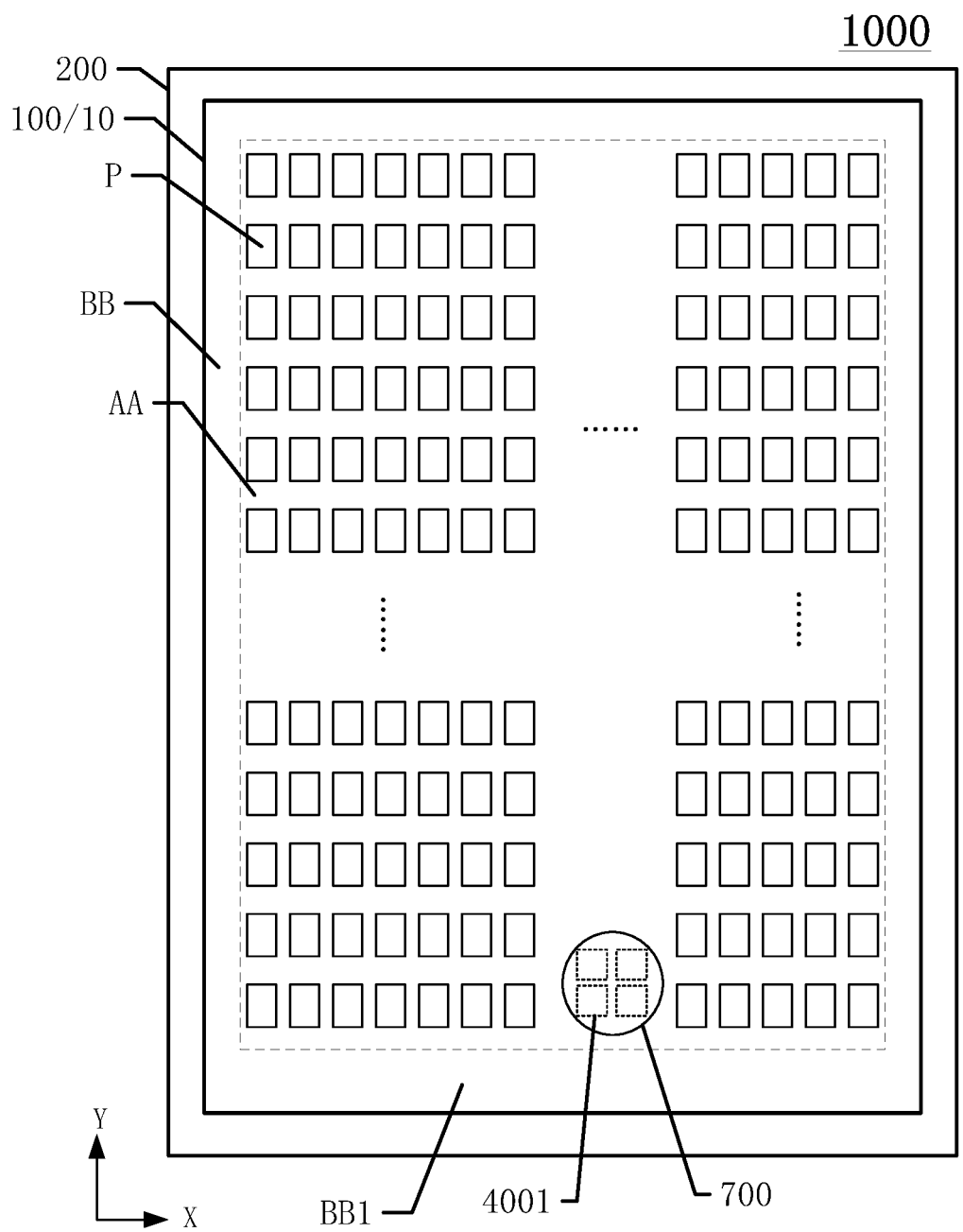
FIG. 21 is a schematic plan view of another display module according to an embodiment of the present disclosure.

In some embodiments, referring to FIG. 21 in combination with FIG. 5, where FIG. 21 is a schematic plan view of another display module according to an embodiment of the present disclosure, the display panel 100 includes a fingerprint identification area 700, and the first through hole 4001 at least partially overlaps with the fingerprint identification area 700 in the direction perpendicular to the plane where the base substrate 10 is located.

The fingerprint identification area 700 is located in the display area AA of the display panel 100, and such design can increase a screen ratio of the display panel 100. FIG. 21 only shows a scenario in which the first through hole 4001 is located in the fingerprint identification area 700 in the direction perpendicular to the plane where the base substrate 10 is located. The first through hole 4001 can also partially overlap with the fingerprint identification area 700 in the direction perpendicular to the plane where the base substrate 10 is located, which is not specifically limited herein.

Since each person's fingerprint is different, fingerprint can be used for identification, and fingerprint identification technology is widely used in technical field of display. Since it needs to touch the fingerprint identification area 700 repeatedly during a fingerprint identification process, the electrostatic charges will be generated during touch process. A photodiode (not shown in the figure) is provided in the fingerprint identification area 700. When a finger touches the screen, a light source illuminates valleys and ridges of the fingerprint of the finger which generates reflected light. Due to different reflection angles and intensities of the reflected light of the valleys and ridges, the light is projected onto the photodiode, and a resistance value of the photodiode is caused to change. Therefore, current of the photodiode changes to identify the valleys and ridges of the fingerprint. If the electrostatic charges are accumulated in the fingerprint identification area 700, the static electricity will directly affect transistor characteristics of pixel circuits in a surrounding area, which may cause partial brightness of the display panel, and the display effect and user experience are seriously affected. Especially before the display panel leaves the factory, the copper rod friction test is usually performed to verify stability of the display panel when sliding the screen for a long time. When a copper rod repeatedly rubs the display panel, the charges are easily accumulated around the fingerprint identification area 700 in the display area, and it is more likely to cause the display to appear bright. Therefore, the problem of static electricity cannot be neglected in an overall display effect of the display panel.

In some embodiments, the photodiode may be located on one side of the base substrate 10 away from the light emission surface of the display panel 100. At this time, since the photodiode needs to receive the reflected light, the composite adhesive layer 400 is usually designed with an opening at a position of the fingerprint identification area 700 to reserve a passage for the reflected light, so as to ensure a fingerprint identification effect. In a reliability test, such as the copper rod friction test, the electrostatic charges tend to accumulate near the fingerprint identification area 700.

In the embodiments of the present disclosure, the first through hole 4001 at least partially overlaps with the fingerprint identification area 700 in the direction perpendicular to the plane where the base substrate 10 is located. After the electrostatic charges are generated due to finger friction during the fingerprint identification process, the electrostatic charges are directly conducted to the flexible printed circuit 300 electrically connected to the conductive structure 500 through the conductive structure 500. Also, the conductive structure 500 is electrically connected to the first conductive region 3001 of the flexible printed circuit 300, so that the electrostatic charges are conducted to avoid static electricity accumulation, which avoids affecting display effect of the fingerprint identification area due to an influence of the charges on pixel circuit characteristics in the fingerprint identification area 700.

In the embodiments of the present disclosure, the conductive structure 500 is arranged near a position corresponding to the fingerprint identification area 700 where the electrostatic charges tend to accumulate, so that the electrostatic charges can be conducted more accurately and purposefully.

Figure 22:
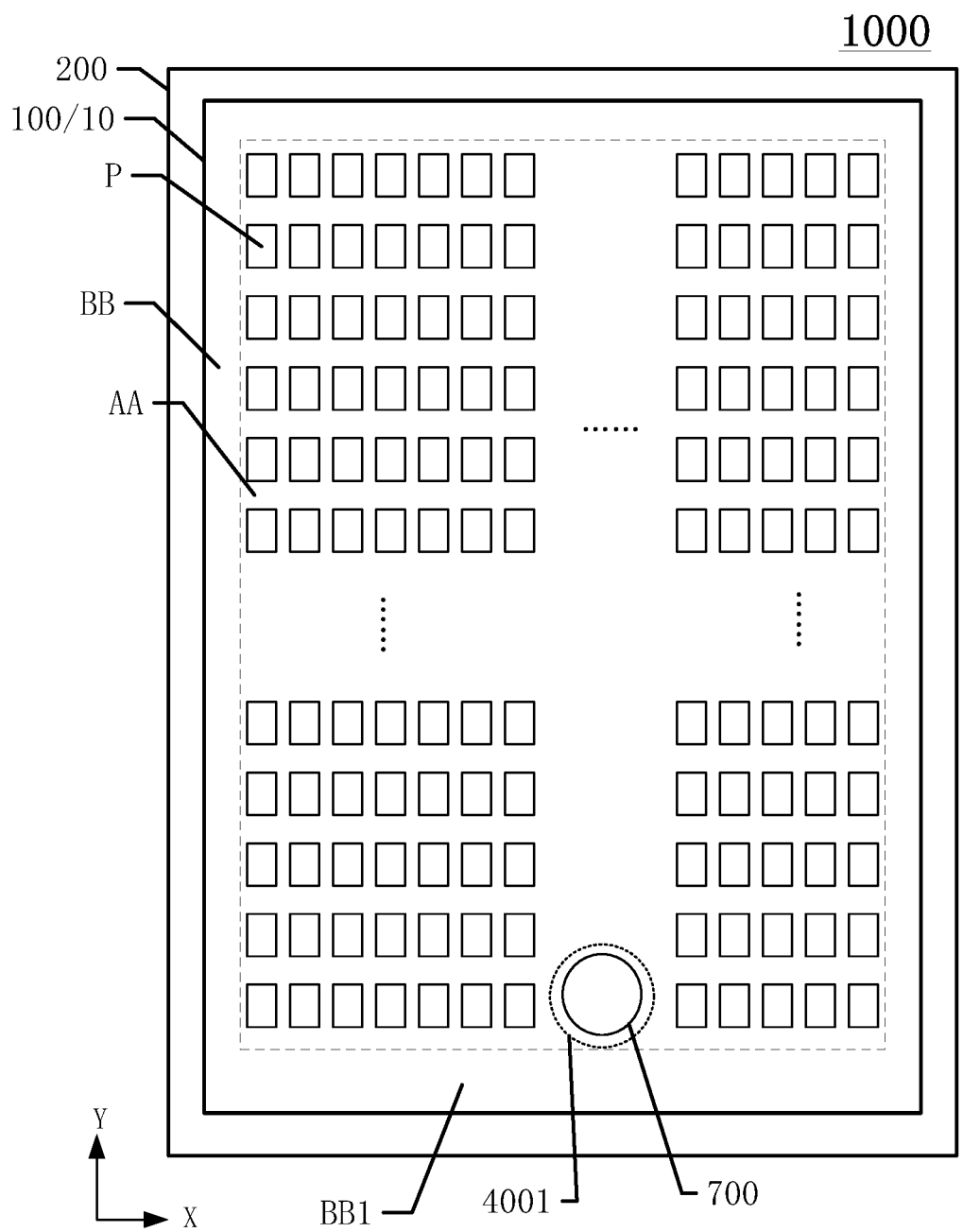
FIG. 22 is a schematic plan view of another display module according to an embodiment of the present disclosure.

In some embodiments, referring to FIG. 22 in combination with FIG. 5, where FIG. 22 is a schematic plan view of another display module according to an embodiment of the present disclosure, the display panel 100 includes the fingerprint identification area 700, and the orthographic projection of the first through hole 4001 on the plane where the base substrate 10 is located at least partially surrounds an orthographic projection of the fingerprint identification area 700 on the plane where the base substrate 10 is located.

The fingerprint identification area 700 is located in the display area AA of the display panel 100, and such design can increase a screen ratio of the display panel 100. FIG. 22 only shows a scenario in which the orthographic projection of the first through hole 4001 on the plane where the base substrate 10 is located completely surrounds the orthographic projection of the fingerprint identification area 700 on the plane where the base substrate 10 is located. The orthographic projection of the first through hole 4001 on the plane where the base substrate 10 is located can also partially surrounds the orthographic projection of the fingerprint identification area 700 on the plane where the base substrate 10 is located, which is not shown in the figure.

As described above, the photodiode (not shown in the figure) is provided in the fingerprint identification area 700. When a finger touches the screen, the light source is reflected when illuminating the valleys and ridges of the fingerprint of the finger. Due to different reflection angles and intensities of the reflected light of the valleys and ridges, the light is projected onto the photodiode, and the resistance value of the photodiode is caused to change. Therefore, the current of the photodiode changes to identify the valleys and ridges of the fingerprint. If the electrostatic charges enter the fingerprint identification area 700, a characteristic curve of the transistor in the pixel circuit will be affected, which causes partial brightness of the display panel, and the display effect and user experience are affected.

In the embodiments of the present disclosure, the orthographic projection of the first through hole 4001 on the plane where the base substrate 10 is located at least partially surrounds the orthographic projection of the fingerprint identification area 700 on the plane where the base substrate 10 is located. In this way, the electrostatic charges located around the fingerprint identification area 700 will be directly conducted to the flexible printed circuit 300 electrically connected to the conductive structure 500 through the conductive structure 500. Also, the conductive structure 500 is electrically connected to the first conductive region 3001 of the flexible printed circuit 300, so that the electrostatic charges are conducted to avoid affecting the display effect of the display panel due to the charges entering the fingerprint identification area 700.

Figure 23:
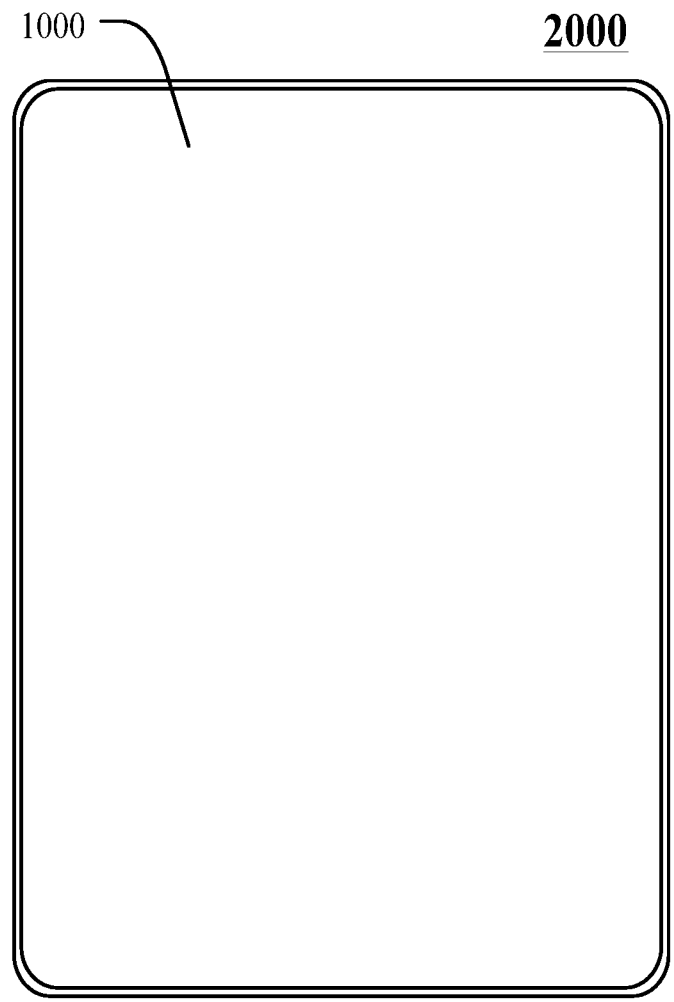
FIG. 23 is a schematic plan view of a display device according to an embodiment of the present disclosure.

In some embodiments, referring to FIG. 23 which is a schematic plan view of a display device according to an embodiment of the present disclosure. A display device 2000 consistent with the present disclosure includes the display module 1000 provided in the above embodiments. In FIG. 23, a mobile phone is taken as an example only to illustrate the display device 2000. It can be understood that the display device 2000 consistent with the present disclosure can be a computer, a television, a vehicle display device, or another display device 2000 with display functions, which is not specifically limited herein. The display device 2000 consistent with the present disclosure has the beneficial effects of the display module 1000 consistent with the present disclosure. As for details, reference may be made to the specific descriptions of the display module 1000 in the above embodiments, which will not be repeated herein.

It can be known from the above embodiments that the display module and the display device provided by the present disclosure have at least the following beneficial effects.

The display panel consistent with the present disclosure is provided with the composite adhesive layer at one side away from the light emission surface, and the composite adhesive layer can protect and dissipate heat for the display panel, which is conducive to improving the reliability and heat dissipation performance of the display panel. The composite adhesive layer includes at least one first through hole penetrating through the composite adhesive layer, and the conductive structure is at least partially located within the first through hole. Along the direction perpendicular to the plane where the base substrate of the display panel is located, the length of the composite adhesive layer H1 is less than or equal to the length of the conductive structure H2.

The flexible printed circuit is electrically connected to the display panel, and the flexible printed circuit includes at least one first conductive region. The conductive structure is electrically connected to the first conductive region of the flexible printed circuit. When external charges are accumulated on the display panel, for example, the charges enter from edges of the display panel during cutting process or electrostatic test process, or enter from the edges of the display panel after accumulated on the cover plate of the display module due to friction and other reasons, since the composite adhesive layer attached to the backlight side of the display panel is provided with the first through hole, and the first through hole is provided with the conductive structure, the charges will reach to the flexible printed circuit that is electrically connected to the conductive structure through the conductive structure. Also, the conductive structure is electrically connected to the first conductive region of the flexible printed circuit, which prevents the charges from entering the display area of the display panel, and avoids the risks such as bright display around the screen, abnormal screen display or split screen phenomenon, decreased sensitivity or even failure, etc. caused by the charges entering the display area of the panel. Therefore, the user experience of the display module is improved, the service life of the display module is prolonged, and the display effect is improved. In addition, compared with the related technologies, in the present disclosure, since it is not needed to reserve a space in the bending area of the display panel to arrange the conductive liquid or conductive silver paste, there is no problem of insufficient avoidance space at the lower edge of the display module, and the width of the lower edge of the display module is not large, which is conducive to realizing the narrow frame. Moreover, compared with the related technologies, in the present disclosure, it is only needed to arrange the first through hole at the composite adhesive layer in the original structure, and to arrange the conductive structure within the first through hole so that the conductive structure is electrically connected to the first conductive region of the flexible printed circuit. The fabrication method is relatively simple, the operations are easy, and the product yield is high. However, in the related technologies, the conductive liquid or conductive silver paste is arranged at the lower edge of the display device, which has relatively high process requirements, and the yield loss is relatively high. Also, the thickness and width of the display module are not increased in the present disclosure, which ensures the thin and narrow frame of the display device while realizing the electrostatic protection.

Although some embodiments of the present disclosure have been described in detail through examples, those skilled in the art should understand that the above examples are for illustration only and not intended to limit the scope of the present disclosure. Those skilled in the art should understand that modifications can be made to the above embodiments without departing from the scope and spirit of the present disclosure, and the scope of the present disclosure is defined by the appended claims.

What is claimed is:

1. A display module comprising:
   a display panel including a base substrate;
   a flexible printed circuit including at least one first conductive region, the flexible printed circuit being electrically connected to the display panel;
   a composite adhesive layer located at one side of the base substrate away from a light emission surface of the display panel; and
   at least one conductive structure, wherein:
the composite adhesive layer includes at least one first through hole penetrating through the composite adhesive layer, and the conductive structure is at least partially located within the first through hole;
along a direction perpendicular to a plane where the base substrate is located, length of the composite adhesive layer is H1, and length of the conductive structure is H2, where H1≤H2; and
the conductive structure is electrically connected to the first conductive region.

2. The display module of claim 1, further comprising:
a first support layer, the base substrate being located at one side of the first support layer close to the light emission surface of the display panel;
wherein:
at least one second through hole penetrating through the first support layer is provided along a direction perpendicular to the plane where the base substrate is located, the conductive structure being at least partially located within the second through hole, and being in contact with the first conductive region and the display panel respectively; and
the first through hole and the second through hole at least partially overlap along the direction perpendicular to the plane where the base substrate is located.

3. The display module of claim 1, wherein an orthographic projection of the conductive structure on the plane where the base substrate is located is within an orthographic projection of the first conductive region on the plane where the base substrate is located.

4. The display module of claim 1, wherein the first conductive region includes a leaked copper.

5. The display module of claim 1, wherein the conductive structure includes a conductive double-sided adhesive.

6. The display module of claim 1, wherein the conductive structure includes a conductive double-sided adhesive and a conductive metal layer.

7. The display module of claim 6, wherein within an orthographic projection of the conductive structure on the plane where the base substrate is located, the conductive double-sided adhesive at least partially surrounds the conductive metal layer.

8. The display module of claim 6, wherein along the direction perpendicular to the plane where the base substrate is located, the conductive structure includes a first conductive double-sided adhesive, the conductive metal layer located at one side of the first conductive double-sided adhesive close to the display panel, and a second conductive double-sided adhesive located at one side of the conductive metal layer close to the display panel.

9. The display module of claim 8, wherein the composite adhesive layer includes a metal layer, and the conductive structure is in contact with the metal layer.

10. The display module of claim 9, wherein the composite adhesive layer includes the metal layer, and the metal layer and the conductive metal layer are integrally structured into a single piece.

11. The display module of claim 9, wherein material of the metal layer includes copper.

12. The display module of claim 9, wherein the composite adhesive layer further includes a first foam layer and a second foam layer, the first foam layer being located at one side of the metal layer close to the display panel, and the second foam layer being located at one side of the metal layer away from the second foam layer.

13. The display module of claim 1, wherein the conductive structure includes a conductive double-sided adhesive and a silver paste.

14. The display module of claim 13, wherein within an orthographic projection of the conductive structure on the plane where the base substrate is located, the conductive double-sided adhesive at least partially surrounds the silver paste.

15. The display module of claim 14, wherein the conductive structure includes a third conductive double-sided adhesive, the silver paste located at one side of the third conductive double-sided adhesive close to the display panel, and a fourth conductive double-sided adhesive located at one side of the silver paste close to the display panel.

16. The display module of claim 1, wherein the first conductive region includes a first metal sheet, and the first metal sheet is made of copper.

17. The display module of claim 1, wherein the first conductive region is grounded, connected to a positive voltage, or electrically connected to an electrostatic circuit.

18. The display module of claim 1, wherein the display panel includes a fingerprint identification area, and the first through hole at least partially overlaps with the fingerprint identification area in the direction perpendicular to the plane where the base substrate is located.

19. The display module of claim 1, wherein the display panel includes a fingerprint identification area, and an orthographic projection of the first through hole on the plane where the base substrate is located at least partially surrounds an orthographic projection of the fingerprint identification area on the plane where the base substrate is located.

20. A display device comprising:
a display module including:
a display panel including a base substrate;
a flexible printed circuit including at least one first conductive region, the flexible printed circuit being electrically connected to the display panel;
a composite adhesive layer located at one side of the base substrate away from light emission surface of the display panel; and
at least one conductive structure;
wherein:
the composite adhesive layer includes at least one first through hole penetrating through the composite adhesive layer, and the conductive structure is at least partially located within the first through hole;
along a direction perpendicular to a plane where the base substrate is located, length of the composite adhesive layer is H1, and length of the conductive structure is H2, where H1≤H2; and
the conductive structure is electrically connected to the first conductive region.

* * * * *